US011584106B2

United States Patent
Kim et al.

(10) Patent No.: US 11,584,106 B2
(45) Date of Patent: Feb. 21, 2023

(54) DISPLAY DEVICE AND METHOD OF MANUFACTURING THE SAME

(71) Applicant: SAMSUNG DISPLAY CO., LTD., Yongin-si (KR)

(72) Inventors: Won Seok Kim, Seoul (KR); Ho Yun Byun, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 221 days.

(21) Appl. No.: 17/152,306

(22) Filed: Jan. 19, 2021

(65) Prior Publication Data
US 2021/0370642 A1    Dec. 2, 2021

(30) Foreign Application Priority Data
May 28, 2020    (KR) .................. 10-2020-0064072

(51) Int. Cl.
| | |
|---|---|
| *B32B 7/14* | (2006.01) |
| *H05K 5/03* | (2006.01) |
| *H05K 5/00* | (2006.01) |
| *B32B 17/10* | (2006.01) |
| *B32B 37/12* | (2006.01) |
| *C09J 201/00* | (2006.01) |
| *C08K 3/013* | (2018.01) |

(52) U.S. Cl.
CPC ............... *B32B 7/14* (2013.01); *B32B 17/10* (2013.01); *B32B 37/1292* (2013.01); *C09J 201/00* (2013.01); *H05K 5/0017* (2013.01); *H05K 5/03* (2013.01); *B32B 2457/20* (2013.01); *C08K 3/013* (2018.01)

(58) Field of Classification Search
CPC ........ H05K 5/03; B32B 7/14; B32B 2457/20; B32B 2457/202; B32B 2457/206; B32B 2457/208
See application file for complete search history.

(56) References Cited

U.S. PATENT DOCUMENTS

| | | | |
|---|---|---|---|
| 11,086,061 B2* | 8/2021 | Luo | ...................... G02B 5/3025 |
| 11,453,178 B2* | 9/2022 | Shin | .................. G02F 1/133512 |
| 2022/0312612 A1* | 9/2022 | An | ........................... G06F 1/16 |

FOREIGN PATENT DOCUMENTS

KR    10-2019-0092163    8/2019

OTHER PUBLICATIONS

Dae-Joong et al., "An ink-jet printing process for developing the characteristics of display panel through an ink of UV-Curable materials basis", Department of Chemical Engineering, Graduate School of Dankook University, 2019, 115 pages.

\* cited by examiner

*Primary Examiner* — Elizabeth E Mulvaney
(74) *Attorney, Agent, or Firm* — F. Chau & Associates, LLC

(57) ABSTRACT

A display panel includes a protection member disposed on the display panel. A bonding layer is disposed between the display panel and the protection member. The bonding layer is configured to bond the display panel and the protection member. The bonding layer includes a first area having a first light transmittance and a second area having a second light transmittance that is lower than the first light transmittance.

20 Claims, 30 Drawing Sheets

DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2020-0064072, filed on May 28, 2020 in the Korean Intellectual Property Office, the disclosure of which is incorporated by reference in its entirety herein.

1. TECHNICAL FIELD

The present inventive concepts relate to a display device and a method of manufacturing the same.

2. DISCUSSION OF RELATED ART

A display device is a device that displays an image. The display device includes a display panel, such as an organic light emitting display panel or a liquid crystal display panel. The display device may include a protective member such as a window for protecting the display panel from an external impact. For example, the window is widely used as a protective member for portable electronic devices, such as smart phones.

In addition, the window and the display panel are manufactured in a bonded state to minimize the overall thickness of the display device and to facilitate the assembly process. For the adhesion between the display panel and the window, a transparent liquid type adhesive such as an optical clear resin (OCR) may be used. During lamination of the adhesive, an inkjet printing apparatus may be used.

SUMMARY

Aspects of the present inventive concepts provide a display device with improved efficiency and reliability of a lamination process of an adhesive layer that bonds a window to a display panel.

Aspects of the present inventive concepts also provide a method of manufacturing a display device with improved efficiency and reliability of a lamination process of an adhesive layer that bonds a window to a display panel.

However, aspects of the present inventive concepts are not restricted to those set forth herein. The above and other aspects of the present inventive concepts will become more apparent to one of ordinary skill in the art to which the present disclosure pertains by referencing the detailed description of exemplary embodiments given below.

An exemplary embodiment of a display device includes a display panel. A protection member is disposed on the display panel. A bonding layer is disposed between the display panel and the protection member. The bonding layer is configured to bond the display panel and the protection member. The bonding layer includes a first area having a first light transmittance and a second area having a second light transmittance that is lower than the first light transmittance.

An exemplary embodiment of a method of manufacturing a display device includes an ink application step including applying a first ink having a first light transmittance on a first area of a first substrate, and applying a second ink having a second light transmittance that is lower than the first light transmittance on a second area of the first substrate. A second substrate is disposed and pressed on the first substrate having the first ink and the second ink applied thereto. The first ink and the second ink is cured to form a bonding layer that is configured to bond the first substrate and the second substrate. One of the first substrate and the second substrate is a display panel, and the other one of the first substrate and the second substrate is a protection member.

According to the display device and the method of manufacturing the display device according to an exemplary embodiment, efficiency and reliability of a lamination process of an adhesive layer that bonds a window to a display panel can be improved.

The effects of the present inventive concepts are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF EXEMPLARY EMBODIMENTS

The present inventive concepts will now be described more fully hereinafter with reference to the accompanying drawings, in which exemplary embodiments of the present inventive concepts are shown. The present inventive concepts may, however, be embodied in different forms and should not be construed as limited to the exemplary embodiments set forth herein.

It will also be understood that when a layer or element is referred to as being "on" another layer, element or substrate, it can be directly on the other layer, element or substrate, or intervening layers and/or elements may also be present. However, when a layer or element is referred to as being "directly on" another layer, element or substrate, no intervening layers and/or elements are present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more exemplary embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, exemplary embodiments will be described in detail with reference to the accompanying drawings.

Figure 1:
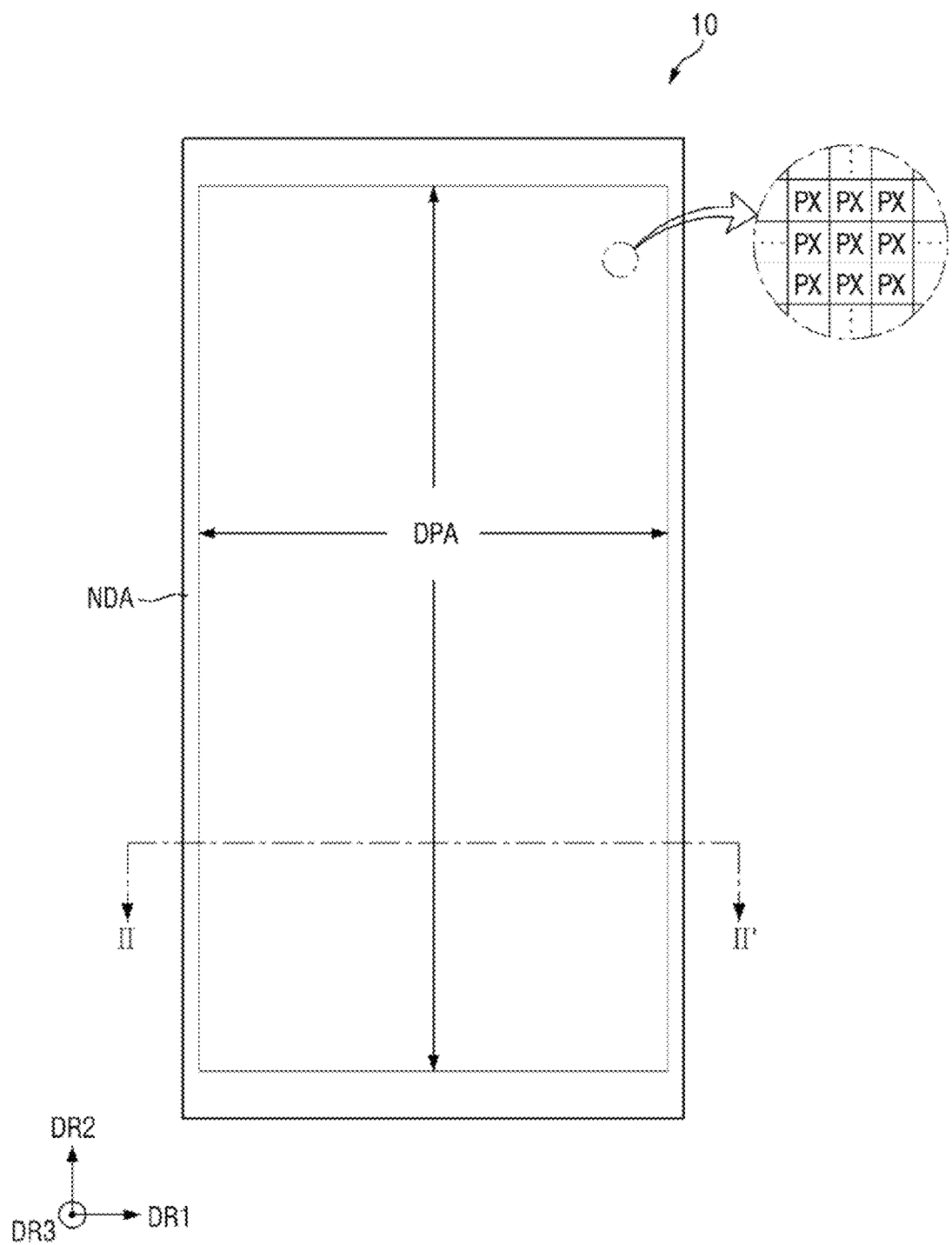
FIG. 1 is a plan view of a display device according to an exemplary embodiment of the present inventive concepts.

FIG. 1 is a plan view of a display device according to an exemplary embodiment of the present inventive concepts.

Referring to FIG. 1, the display device 10 according to an exemplary embodiment may have a substantially rectangular shape in plan view. The display device 10 may have a rectangular shape with right-angled corners in a plan view (e.g., in a plane defined in the first and second directions DR1, DR2). However, the present inventive concepts are not limited thereto, and the display device 10 may have a rectangular shape with rounded corners in a plan view. In other exemplary embodiments, the display device 10 may have various different shapes such as a polygonal shape, spherical shape, an irregular shape, etc.

In the drawings, a first direction DR1 indicates a horizontal direction of a display device 10 in plan view, and a second direction DR2 indicates a vertical direction of the display device 10 in plan view. Further, a third direction DR3 indicates a thickness direction of the display device 10. The first direction DR1 and the second direction DR2 perpendicularly intersect each other. However, exemplary embodiments of the present inventive concepts are not limited thereto and in other exemplary embodiments the first direction DR1 and the second direction DR2 may intersect each other at various different angles. The third direction DR3 is a direction intersecting the plane on which the first direction DR1 and the second direction DR2 are located, and perpendicularly intersects both the first direction DR1 and the second direction DR2. However, exemplary embodiments of the present inventive concepts are not limited thereto and the third direction DR3 may intersect the first direction DR1 and the second direction DR2 at various different angles. It should be understood, however, that a direction mentioned in exemplary embodiments of the present inventive concepts refers to a relative direction and the exemplary embodiments are not limited to the direction mentioned.

Unless otherwise defined, with respect to the third direction DR3, the terms "above," "top surface," and "upper side" as used herein refer to a display surface's side of a display panel 100, and the terms "below," "bottom surface," and "lower side" as used herein refer to a side opposite to the display surface of the display panel 100.

The display device 10 displays an image through a display area DPA, and various devices including the display area DPA may be included therein. Examples of the display device 10 may include, but are not limited to, a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, various medical devices, various inspection devices, various household appliances such as a refrigerator and a washing machine including the display area DPA, an Internet-of-Things device, and the like. However, exemplary embodiments of the present inventive concepts are not limited thereto.

The display device 10 includes the display area DPA and a non-display area NDA. The display area DPA is an area where an image is displayed, and the non-display area NDA is an area where an image is not displayed.

A plurality of pixels PX may be disposed in the display area DPA. The pixel PX is a basic unit for displaying an image. In an exemplary embodiment, the pixels PX may include a red pixel, a green pixel, and a blue pixel. However, exemplary embodiments of the present inventive concepts are not limited thereto. The plurality of pixels PX may be alternately arranged in plan view (e.g., in a plane defined in the first and second directions DR1, DR2). For example, the pixels PX may be arranged in a matrix, but the present disclosure is not limited thereto.

The non-display area NDA may be disposed around the display area DPA. The non-display area NDA may be disposed around the display area DPA and may surround the display area DPA. As shown in the exemplary embodiment of FIG. 1, the display area DPA may be formed in a rectangular shape, and the non-display area NDA may be disposed around all four sides of the display area DPA. However, exemplary embodiments of the present inventive concepts are not limited thereto. For example, in some exemplary embodiments, the display area DPA may extend to one or more edges of the display device 10 and the non-display area NDA may not surround such edges.

Hereinafter, components of the display device 10 will be described with reference to FIG. 2.

Figure 2:
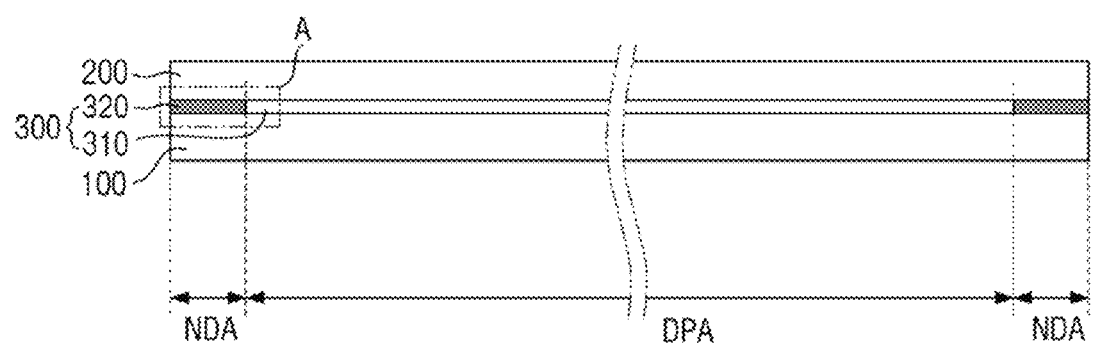
FIG. 2 is a cross-sectional view taken along line II-IP of FIG. 1 according to an exemplary embodiment of the present inventive concepts.

FIG. 2 is a schematic cross-sectional view taken along line II-IP of FIG. 1.

Referring to FIG. 2, the display device 10 includes a display panel 100, a protection member 200 for a display device disposed on the display panel 100, and a bonding layer 300 interposed between the display panel 100 and the protection member 200 for a display device (e.g., in the third direction DR3).

The display panel 100 may display an image and a video. Examples of the display panel 100 may include not only a self-luminous display panel such as an organic light emitting display (OLED) panel, an inorganic electroluminescence (EL) display panel, a quantum dot (QED) display panel, a micro-LED display panel, a nano-LED display panel, a plasma display panel (PDP), a field emission display (FED) panel and a cathode ray tube (CRT) display panel, but also a light receiving display panel such as a liquid crystal display (LCD) panel and an electrophoretic display (EPD) panel.

The protection member 200 for a display device is disposed above the display surface of the display panel 100. Here, the display surface of the display panel 100 refers to a surface from which light is emitted to display an image thereon. In exemplary embodiments in which the display device is a transmissive display device or a double-sided display device which displays images on both surfaces, both surfaces (e.g., front and rear surfaces in the third direction DR3) may become display surfaces. In this exemplary embodiment, the protection member 200 for a display device may be disposed at any one of, or both surfaces (e.g., front and/or rear surfaces in the third direction DR3).

The display panel 100 may further include a polarization member and/or an impact absorbing layer. The polarization member may be disposed on the display panel 100. The polarization member polarizes the light passing therethrough. The polarization member may serve to reduce the reflection of external light. The impact absorbing layer may absorb an impact applied from the outside and protect the display device 10 and the display panel 100 from the external impact.

In addition, the display device 10 may further include a touch member. The touch member may be formed as a separate panel or film to be disposed between the display panel 100 and the protection member 200, to be directly formed on the display panel 100, or to be formed inside the display panel 100.

The protection member 200 for a display device may be referred to as a window, a protective glass, a protective film, a cover member, a cover glass, a cover film, a cover sheet, or the like. Hereinafter, for convenience of description, the protection member 200 for a display device will be abbreviated as the protection member 200.

In an exemplary embodiment, the protection member 200 may have a plate-like sheet shape having a predetermined thickness. The protection member 200 may have a planar shape that is substantially similar to a planar shape of the display device 10 to which the protection member 200 is applied and the protection member 200 may cover an entire surface of the display panel 100 (e.g., an upper surface and/or a lower surface of the display panel 100). When the display device 10 has a rectangular shape, the planar shape of the protection member 200 may also be rectangular.

The protection member 200 may be disposed on the display surface of the display panel 100. Although the present disclosure is not limited thereto, in an exemplary embodiment, the protection member 200 may have a larger area than the display panel 100. The display panel 100 completely overlaps the protection member 200 in the third direction DR3.

In an exemplary embodiment, the side surface of the protection member 200 may protrude outward from the side surface of the display panel 100. The protection member 200 may protrude from any of the sides of the display panel 100. For example, when the display panel 100 has a rectangular shape, the protection member 200 may protrude from all four sides of the display panel 100. A distance that the protection member 200 protrudes from the adjacent side of the display panel 100 may be different on one or more sides or may be the same on all sides.

In an exemplary embodiment, the protection member 200 may include ultra-thin glass (UTG) or thin glass. In exemplary embodiments in which the protection member 200 is formed of an ultra-thin film or a thin film, the protection member 200 may have a flexible property. For example, the protection member 200 may be twisted, bent, folded, or rolled. In an exemplary embodiment, the thickness of the protection member 200 (e.g., length in the third direction DR3) may be in a range of about 10 μm to about 300 μm. However, exemplary embodiments of the present inventive concepts are not limited thereto. In one exemplary embodiment, the protection member 200 having a thickness in a range of about 30 μm to about 80 μm. For example, the thickness of the protection member 200 may be about 50 μm.

In an exemplary embodiment, the protection member 200 may include soda-lime glass, alkali aluminosilicate glass, borosilicate glass, or lithium alumina silicate glass. However, exemplary embodiments of the present inventive concepts are not limited thereto.

The protection member 200 may include chemically strengthened or thermally strengthened glass to have strong rigidity. Chemical strengthening may be achieved through an ion exchange process in alkaline salts. In an exemplary embodiment, the ion exchange process may be performed two or more times. However, exemplary embodiments of the present inventive concepts are not limited thereto.

As shown in the exemplary embodiment of FIG. 2, the bonding layer 300 is positioned directly on an upper surface of the display panel 100. As shown in the exemplary embodiment of FIG. 2, the protection member 200 is positioned directly on an upper surface of the bonding layer 300. The bonding layer 300 positioned between the display panel 100 and the protection member 200 may bond the display panel 100 to the protection member 200. For example, the display panel 100 and the protection member 200 may be mutually coupled to each other through the bonding layer 300.

A partial area of the bonding layer 300 may be optically transparent, and another partial area thereof may be optically opaque. For example, since light emitted from the display panel 100 is visible to the user after passing through the bonding layer 300, at least a portion of the bonding layer 300 may be optically transparent, and a partial area of the bonding layer 300 may be optically opaque to prevent light leakage. A detailed description thereof will be made with reference to the exemplary embodiments of FIGS. 4 to 7.

Figure 3:
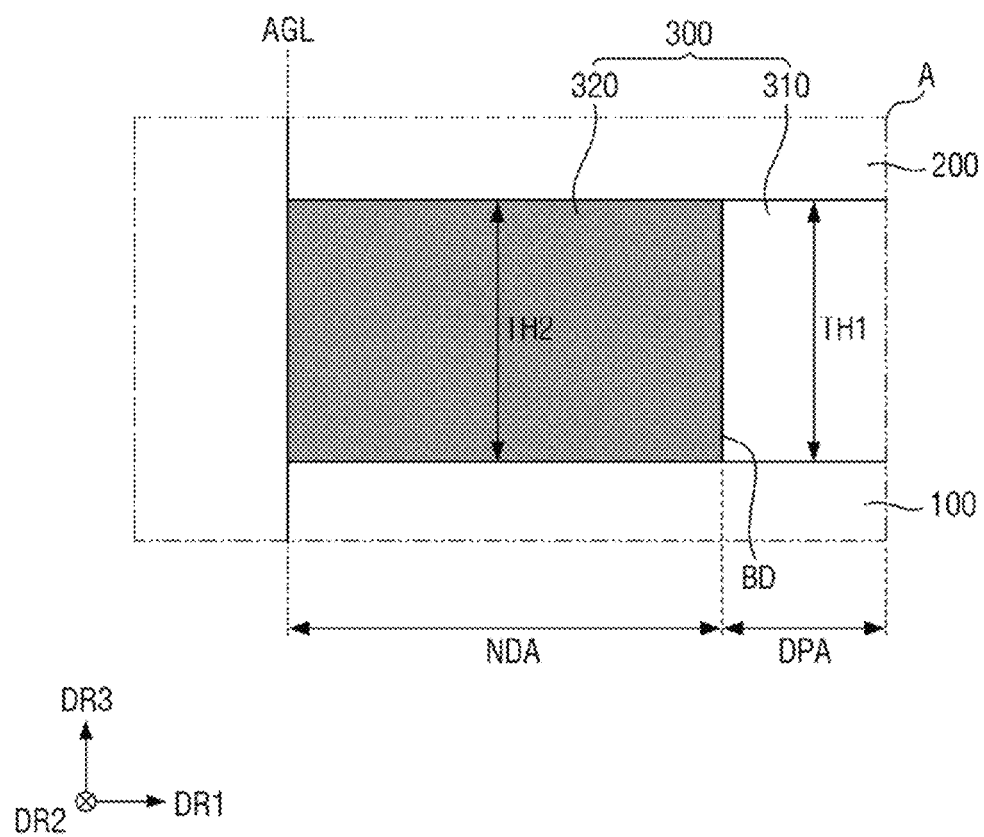
FIG. 3 is an enlarged view of region A of FIG. 2 according to an exemplary embodiment of the present inventive concepts.
Figure 4:
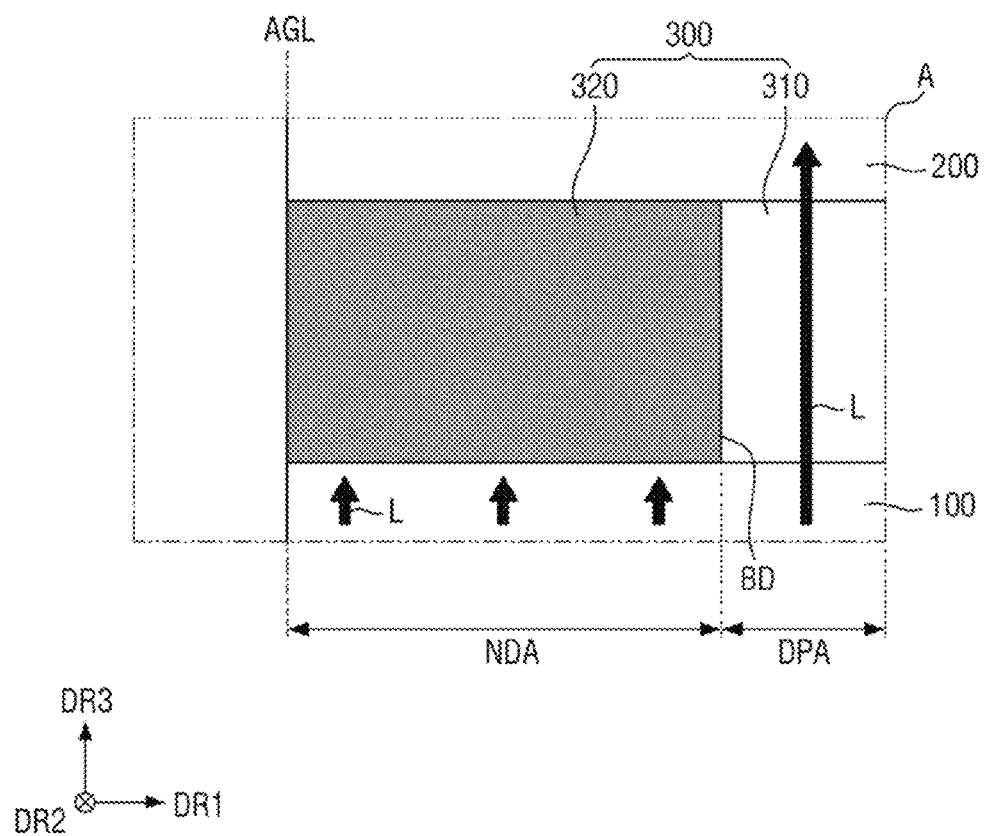
FIG. 4 is an enlarged view of region A of FIG. 2 illustrating a state in which light is shielded or transmitted in a bonding layer according to an exemplary embodiment of the present inventive concepts.
Figure 5:
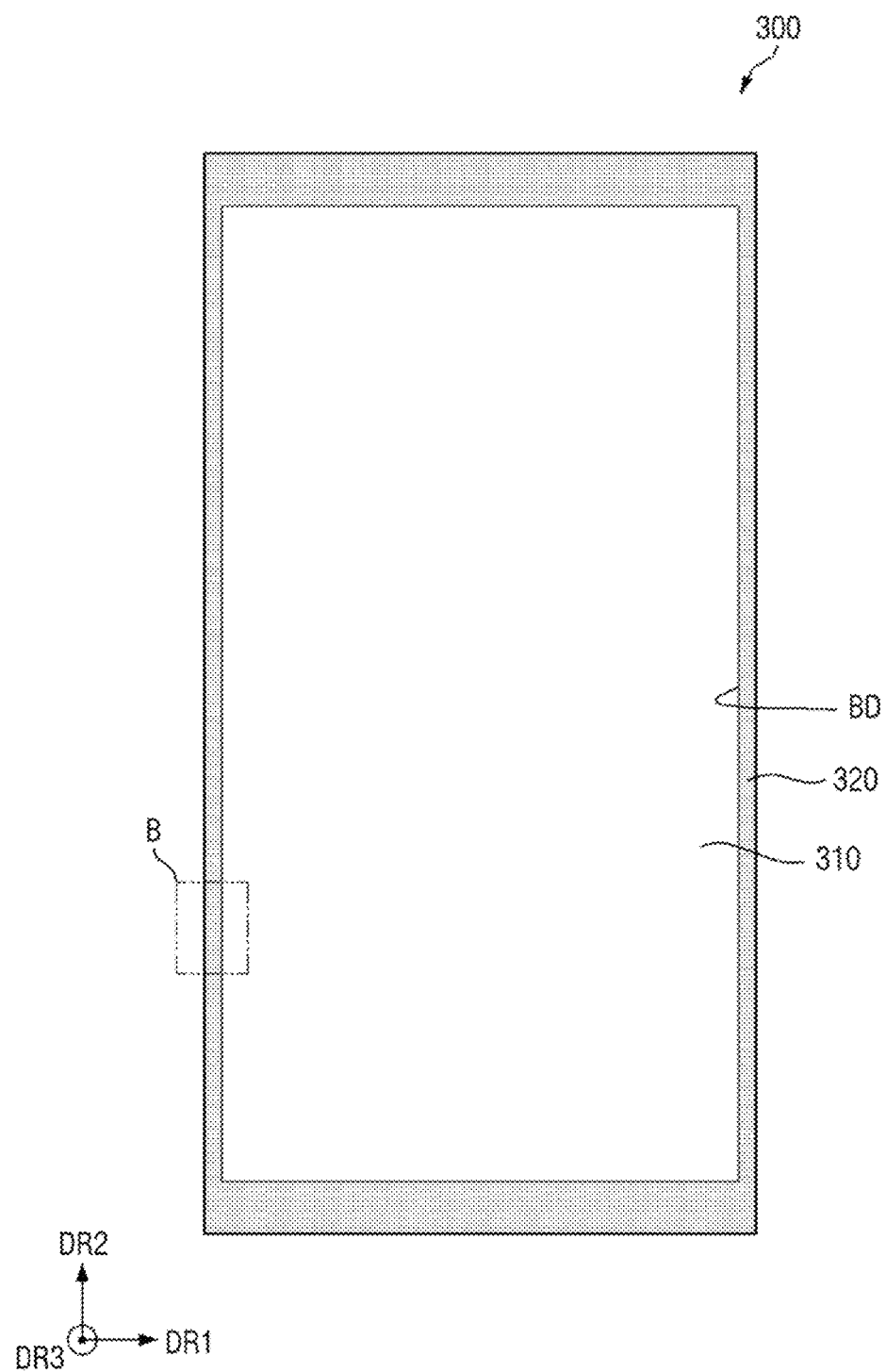
FIG. 5 is a plan view of a bonding layer according to an exemplary embodiment of the present inventive concepts.
Figure 6:
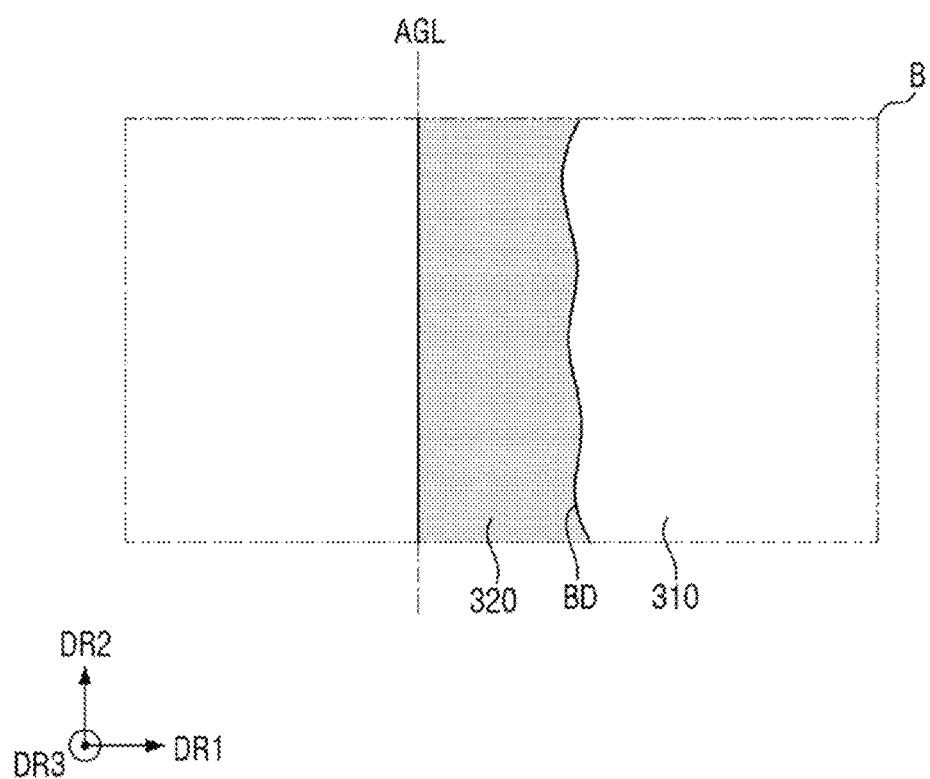
FIG. 6 is an enlarged view of region B of FIG. 5 according to an exemplary embodiment of the present inventive concepts.

FIG. 3 is an enlarged view of region A of FIG. 2. FIG. 4 is a view illustrating a state in which light is shielded or transmitted in a bonding layer according to an embodiment. FIG. 5 is a plan view of a bonding layer according to an embodiment. FIG. 6 is an enlarged view of region B of FIG. 5.

Referring further to the exemplary embodiments of FIGS. 3 to 6, the bonding layer 300 may bond the protection member 200 disposed thereabove and the display panel 100 therebelow to each other. For example, the protection member 200 and the display panel 100 are coupled to each other through the bonding layer 300. In an exemplary embodiment, the bonding layer 300 may have tackiness/adhesive strength of at least about 500 gf/in under room temperature (25° C.) and 50% humidity conditions such that the protection member 200 does not peel off from the side of the display panel 100. In addition, in terms of resisting an external impact and ensuring resilience against deformation, the bonding layer 300 may have a storage modulus in a range from about 80 MPa to about 120 MPa under the above conditions. In addition, the bonding layer 300 may have a predetermined creep property to relieve stress when being folded or bent, which may be in a range of about 50% to about 800% under the above conditions.

The bonding layer 300 may include a first area 310 that is a light transmitting area and a second area 320 that is a light blocking area. For example, the first area 310 may be an area that transmits light emitted from the display panel 100, and the second area 320 may be an area that blocks light emitted from the display panel 100. The first area 310 allows light emitted from the display panel 100 to pass through the first area 310 of the bonding layer 300 and be recognized by the user. The second area 320 may prevent light emitted from the display panel 100 from being viewed in an undesired area and prevent light leakage.

The first area 310 may have a first light transmittance, and the second area 320 may have a second light transmittance. The first light transmittance of the first area 310 may be greater than the second light transmittance of the second area 320. In an exemplary embodiment, the first light transmittance of the first area 310 may be greater than or equal to about 90%, or greater than or equal to about 95%. However, exemplary embodiments of the present inventive concepts are not limited thereto. The second light transmittance of the second area 320 may be less than the first light transmittance of the first area 310. In an exemplary embodiment, the second light transmittance of the second area 320 may be less than or equal to about 5%, or less than or equal to about 1%. However, exemplary embodiments of the present inventive concepts are not limited thereto.

The shape of the first area 310 in plan view may correspond to the shape of the display area DPA of the display device 10 in the plan view, and the first area 310 may overlap the display area DPA in the thickness direction (e.g., in the third direction DR3). For example, the first area 310 may be disposed in the display area DPA.

The first area 310 may be positioned directly on the display panel 100 therebelow, and the protection member 200 may be positioned directly on the first area 310. That is, a first surface of the first area 310 of the bonding layer 300 may directly contact the display panel 100 therebelow, and the opposite second surface of the first area 310 of the bonding layer 300 may directly contact the protection member 200 thereabove. For example, as shown in the exemplary embodiment of FIG. 2, a lower surface of the first area 310 of the bonding layer 300 may directly contact an upper surface of the display panel 100 and an upper surface of the first area 310 of the bonding layer may directly contact a lower surface of the protection member 200. However, exemplary embodiments of the present inventive concepts are not limited thereto. For example, in other exemplary embodiments, at least one layer may be interposed between the first and second areas 310, 320 of the bonding layer 300 and the display panel 100 and/or first and second areas 310, 320 of the bonding layer 300 and the protection member 200. While directly contacting the protection member 200 thereabove and the display panel 100 therebelow, the first area 310 may adhere to both of the above-mentioned components. The bonding layer 300 may have bonding strength (or adhesive strength) on both the upper side and the lower side in the first area 310, and may be bonded (or adhered) with the protection member 200 thereabove and the display panel 100 therebelow to couple (e.g., to affix) the protection member 200 to the display panel 100.

In an exemplary embodiment, the first area 310 may include an adhesive material such as a transparent resin. For example, the first area 310 may include an optical clear resin (OCR).

The first area 310 may include a photocurable resin that is cured by ultraviolet (UV) irradiation. In an exemplary embodiment, the photocurable resin may be composed of a monomer, an oligomer, or the like, and may be cured by being polymerized into a polymer due to light irradiation of a specific wavelength to exhibit adhesive strength. The photocurable resin may include, for example, one or materials selected from acrylic resin, silicone resin, epoxy resin, urethane resin, and composite resin thereof. However, exemplary embodiments of the present inventive concepts are not limited thereto.

In addition, the first area 310 may include a photoinitiator that generates free radicals or ions due to light stimulation such as ultraviolet light. In an exemplary embodiment, the photoinitiator may include at least one compound selected from alpha-hydroxyketone, mono- or bisacylphosphine oxide, benzophenone, thioxanthone, ketosulfone, benzyl ketal, phenylglyoxylate, borate, titanocene, and oxime ester-based photoinitiators, and the like. However, exemplary embodiments of the present inventive concepts are not limited thereto.

The shape of the second area 320 in a plan view (e.g., in a plane defined in the first and second directions DR1, DR2) may correspond to the shape of the non-display area NDA of the display device 10 in the plan view, and the second area 320 may overlap the non-display area NDA in the thickness direction (e.g., the third direction DR3). For example, the second area 320 may be disposed in the non-display area NDA.

The second area 320 may be disposed outside the first area 310. For example, the second area 320 may be positioned on at least one lateral side of the first area 310 (e.g., a lateral side in the first direction DR1 and/or the second direction DR2). In an exemplary embodiment, the second area 320 may be disposed on all sides of the first area 310, and may be disposed to surround the first area 310 (e.g., in the first and second directions DR1, DR2). However, exemplary embodiments of the present inventive concepts are not limited thereto, and the second area 320 may be disposed only on a partial portion of the lateral side surfaces of the first area 310.

A boundary surface BD may be positioned between the first area 310 and the second area 320. The boundary surface BD may include a portion that is not parallel to the outside of the bonding layer 300 or the second area 320 in plan view. For example, in an exemplary embodiment, the boundary surface BD may extend in a direction that is inclined with respect to the first direction DR1 and/or the second direction DR2 in a plan view in at least a partial area. For example, at least a partial portion of the boundary surface BD may be formed to be inclined with respect to the first direction DR1 and/or the second direction DR2 in a plan view. In addition, the boundary surface BD may be formed in a curved shape in at least a partial portion in a plan view. As shown in the exemplary embodiment of FIG. 6, in the at least partial portion having a curved shape, the boundary surface BD may include, a convex shape toward the outside of the display device (refer to 10 in FIG. 1), a concave shape toward the inside thereof, and/or a shape formed as a combination thereof, or the like. However, exemplary embodiments of the present inventive concepts are not limited thereto. Accordingly, the boundary surface BD may include at least one inflection point in a plan view.

As shown in the exemplary embodiment of FIG. 3, the boundary surface BD in a cross-sectional view may be formed perpendicularly to the display panel 100 and/or the protection member 200. However, exemplary embodiments of the present inventive concepts are not limited thereto. The cross-sectional shape of the boundary surface BD may be variously formed. A detailed description thereof will be given later through other exemplary embodiments and the like.

In an exemplary embodiment, the second area 320 may include the same material as the material of the above-described first area 310 (e.g., a transparent resin, a photo-curable resin, a photoinitiator, or the like). However, the second area 320 may include more photoinitiators per unit area than the first area 310. For example, the concentration of the photoinitiators included in the second area 320 may be greater than the concentration of the photoinitiators included in the first area 310.

Accordingly, the second ink in the second area 320 (refer to '320a' in FIGS. 7 to 10) may have a greater degree of curing than the first ink in the first area 310 (refer to '310a' in FIGS. 7 to 10), by pre-curing with ultraviolet irradiation to be described later. Thereafter, in a vacuum surface bonding process, drops of the second ink (refer to '320a' in FIGS. 7 to 10) may be mixed with each other, but the second ink (refer to '320a' in FIGS. 7 to 10) and the first ink (refer to '310a' in FIGS. 7 to 10) may not be mixed with each other, thereby forming the boundary surface BD between the second ink in the second area 320 (refer to '320a' in FIGS. 7 to 10) and the first ink in the first area 310 (refer to '310a' in FIGS. 7 to 10). Accordingly, the first area 310 through which light is transmitted and the second area 320 that blocks light may be clearly distinguished, and each of the first area 310 and the second area 320 may be formed to correspond to each of the display area DPA and the non-display area NPA of the display device 10.

The second area 320 may further include a dye or a pigment. The dye or the pigment may absorb light. For example, in an exemplary embodiment, the dye or the pigment may be a black dye or a pigment that absorbs all of the light in the visible wavelength range. However, exemplary embodiments of the present inventive concepts are not limited thereto, and the dye or the pigment may be a dye or a pigment that absorbs light outside the wavelength range of a specific color (e.g., red, blue, or white) and reflects light in the wavelength range of a specific color (e.g., red, blue, or white). Accordingly, as shown in the exemplary embodiment of FIG. 4, the second area 320 includes a dye or a pigment, the second area 320 may absorb most of the light L emitted from the display panel 100 and block the light L emitted from the display panel 100.

The second area 320 may be positioned directly on the display panel 100 therebelow, and the protection member 200 may be positioned directly on the second area 320. That is, a first surface of the second area 320 of the bonding layer 300 may directly contact the display panel 100 therebelow, and the opposite second surface of the second area 320 of the bonding layer 300 may directly contact the protection member 200 thereabove. For example, as shown in the exemplary embodiment of FIG. 2, a lower surface of the second area 320 of the bonding layer 300 may directly contact an upper surface of the display panel 100 and an upper surface of the second area 320 of the bonding layer may directly contact a lower surface of the protection member 200. However, exemplary embodiments of the present inventive concepts are not limited thereto. While directly contacting the protection member 200 thereabove and the display panel 100 therebelow, the second area 320 may adhere to both of the above-mentioned components (e.g., the protection member 200 and the display panel 100). The bonding layer 300 may have bonding strength (or adhesive strength) on both the upper side and the lower side in the second area 320, and may be bonded (e.g., adhered) with the protection member 200 above and the display panel 100 below to couple (e.g., to affix) the protection member 200 to the display panel 100.

The bonding strength (e.g., adhesive strength) of the bonding layer 300 in the second area 320 may correspond to the bonding strength (e.g., adhesive strength) in the first area 310. For example, the deviation (e.g., the difference) between the bonding strength (e.g., adhesive strength) at which the bonding layer 300 bonds (e.g., adheres) to the display panel 100 therebelow in the second area 320 and the bonding strength (e.g., adhesive strength) at which the bonding layer 300 bonds (e.g., adheres) to the display panel 100 therebelow in the first area 310 may be within a range of about 10% or less, or about 50% or less. In addition, the deviation (e.g., the difference) between the bonding strength (or adhesive strength) in which the bonding layer 300 bonds (e.g., adheres) to the protection member 200 thereabove in the second area 320 and the bonding strength (or adhesive strength) in which the bonding layer 300 bonds (or adheres) to the protection member 200 thereabove in the first area 310 may be within a range of about 10% or less, or about 50% or less.

As shown in the exemplary embodiment of FIG. 3, a thickness TH2 (e.g., length in the third direction DR3) of the second area 320 may be substantially the same as a thickness TH1 (e.g., length in the third direction DR3) of the first area 310. However, the thicknesses TH1 and TH2 of the first area 310 and the second area 320 are not limited thereto and may have a range from about 25 μm to about 50 μm or from about 15 μm to about 80 μm.

The outside of the second area 320 may be aligned with the side surfaces of the display panel 100 and the protection member 200. For example, as shown in the exemplary embodiment of FIG. 3, the lateral side surfaces of the display panel 100, the bonding layer 300, such as the second area 320, and the protection member 200 may all be aligned with an alignment plane AGL or an alignment line having a straight cross-sectional shape (e.g., extending in the third direction DR3). The lateral side surfaces of the display panel 100, the bonding layer 300, and the protection member 200 are not limited thereto, but may be cut surfaces, such as surfaces that are cut together on a same line.

As described later, the first area 310 and the second area 320 of the bonding layer 300 may be formed together in one process.

The method of manufacturing the bonding layer 300 and the display device 10 will be described in detail with reference to the exemplary embodiments of FIGS. 7 to 14. In an exemplary embodiment, the above-described bonding layer 300 may be formed by an inkjet printing method.

Figure 7:
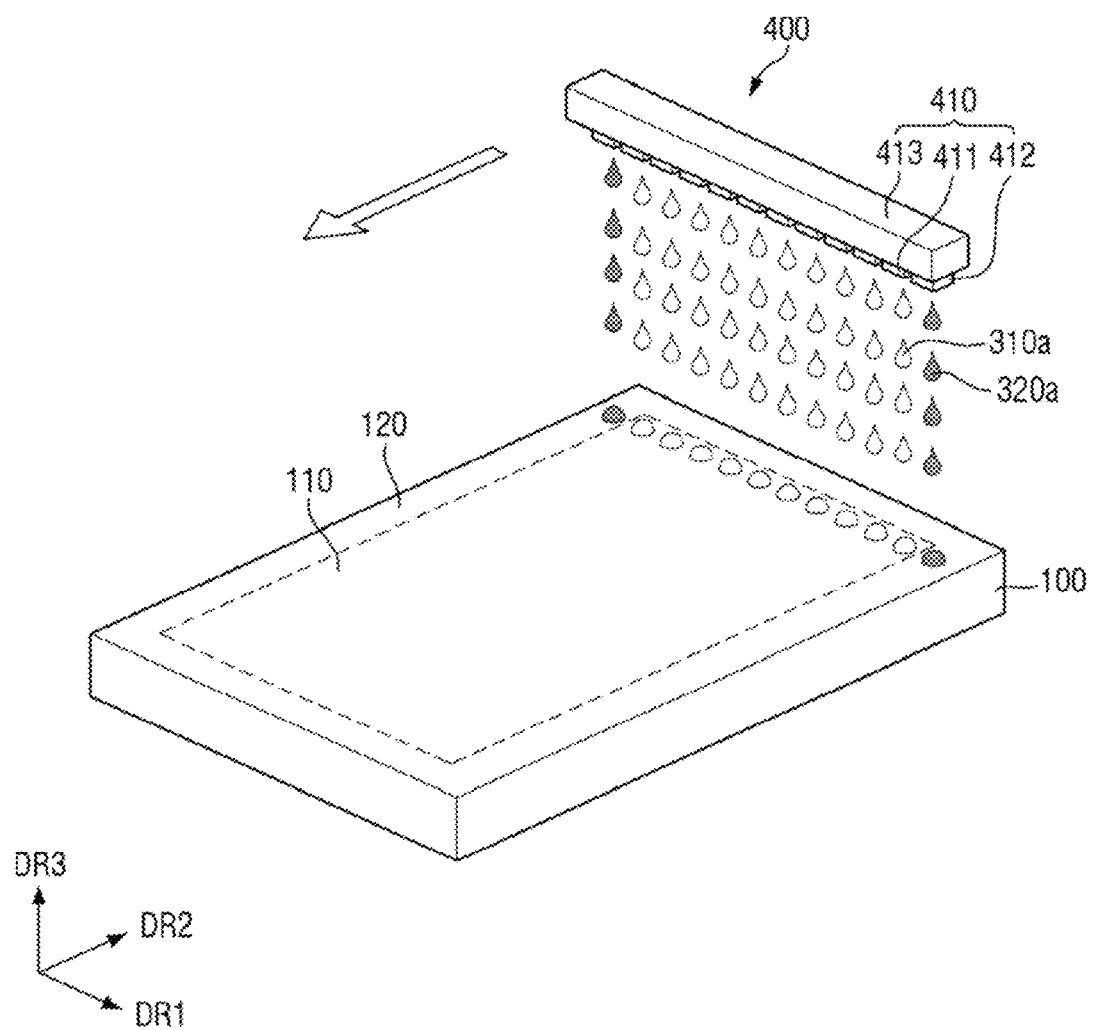
FIG. 7 is a perspective view illustrating a process of applying the first ink and the second ink to the display panel according to an exemplary embodiment of the present inventive concepts.
Figure 8:
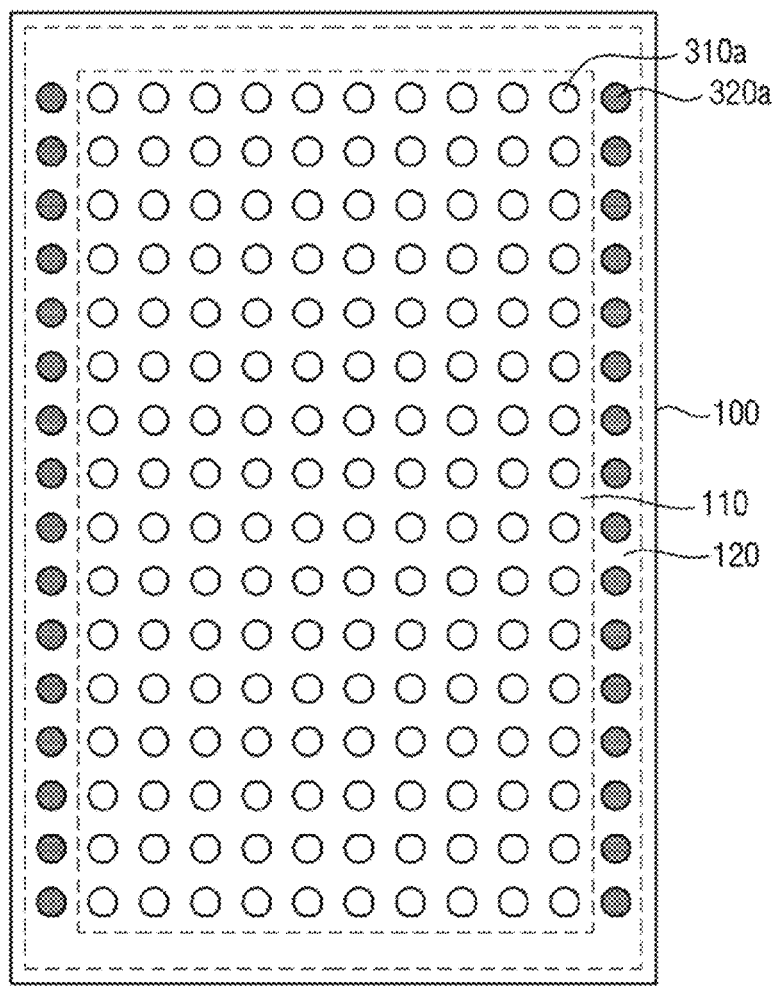
FIG. 8 is a plan view illustrating the first ink and the second ink applied by the process of FIG. 7 according to an exemplary embodiment of the present inventive concepts.
Figure 8:
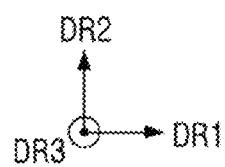
Figure 9:
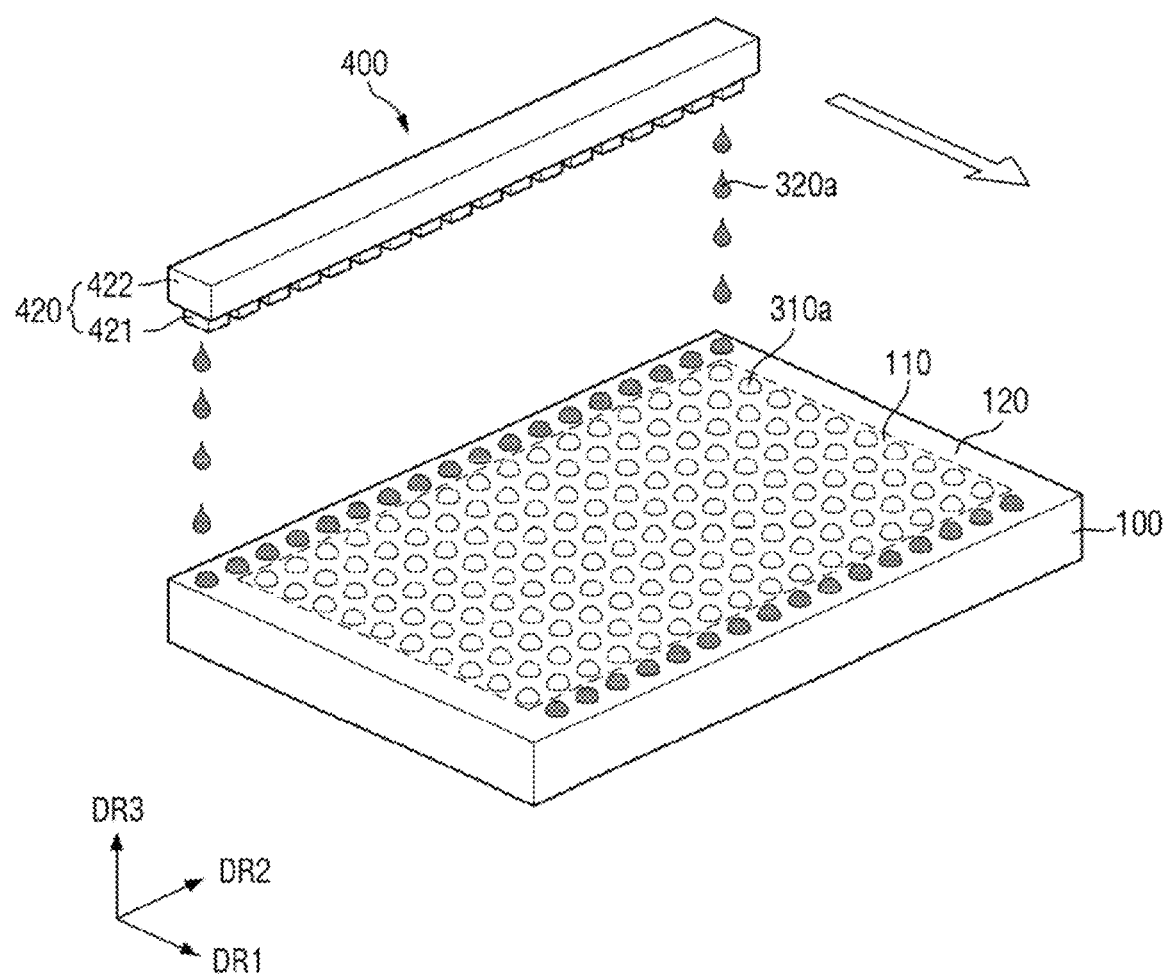
FIG. 9 is a perspective view illustrating a process of applying the second ink after the process of FIG. 7 according to an exemplary embodiment of the present inventive concepts.
Figure 10:
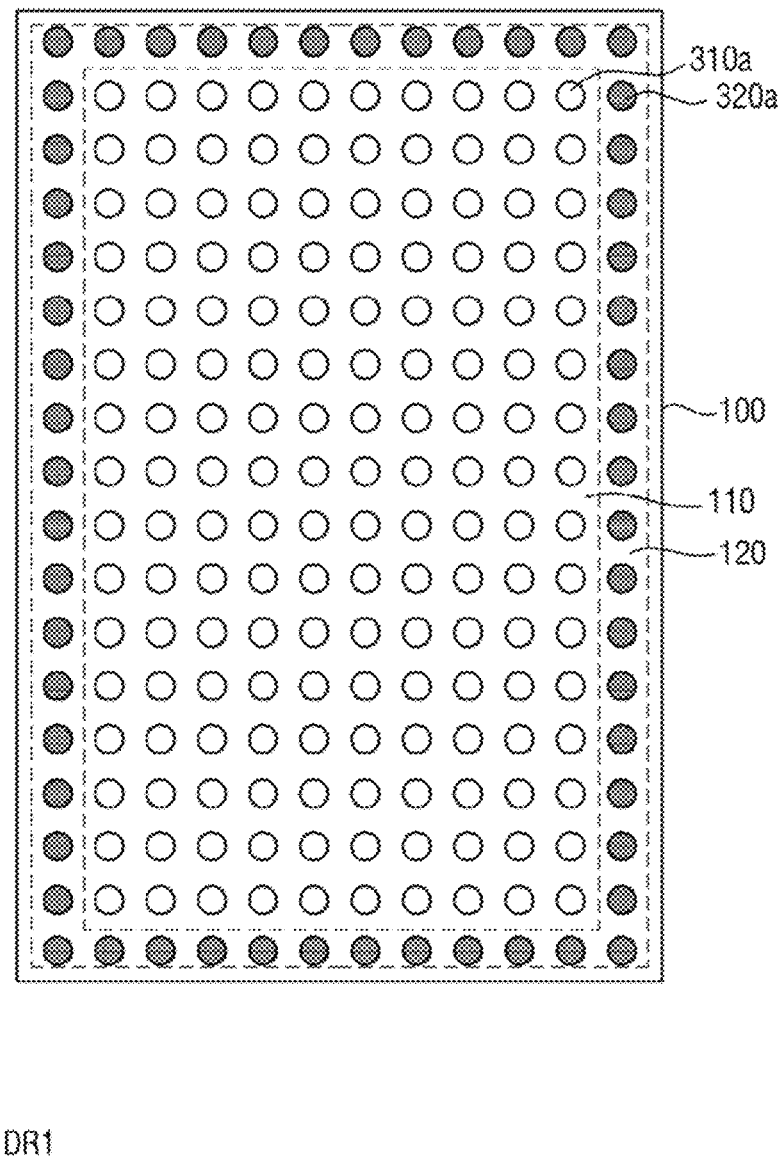
FIG. 10 is a plan view illustrating the first ink and the second ink applied by the process of FIGS. 7 and 9 according to an exemplary embodiment of the present inventive concepts.

FIG. 7 is a perspective view illustrating a process of applying the first ink and the second ink to the display panel. FIG. 8 is a plan view illustrating the first ink and the second ink applied by the process of FIG. 7. FIG. 9 is a view illustrating a process of applying the second ink after the process of FIG. 7. FIG. 10 is a plan view illustrating the first ink and the second ink applied by the process of FIGS. 7 and 9. First, a process of applying the first ink 310a and the second ink 320a to the display panel 100 by an inkjet printing method will be described with reference to FIGS. 7 to 10.

Hereinafter, for convenience of description, the sizes of the first ink 310a and the second ink 320a are illustrated to be larger than the actual sizes, and the numbers of drops of the first ink 310a and the second ink 320a are illustrated to be less than the actual numbers for convenience of explanation. For example, the size, the drop number, the shape, or the like of the first ink 310a and the second ink 320a are not limited to those illustrated in the drawings. In an actual process, the sizes of the first ink 310a and the second ink 320a may be smaller than those illustrated, and the drop numbers of the first ink 310a and the second ink 320a may be larger than those illustrated and the shapes of the drops of the first ink 310a and the second ink 320a may vary.

Referring to the exemplary embodiments of FIGS. 7 to 10, the display panel 100 may include a first area 110 and a second area 120. The position in which the first area 110 of the display panel 100 is disposed corresponds to the position in which the first area 310 of the bonding layer 300 is disposed, and the position in which the second area 120 of the display panel 100 is disposed corresponds to the position in which the second area 320 of the bonding layer 300 is disposed.

The inkjet printing apparatus 400 may include a first print unit 410 and a second print unit 420. The first ink 310a and the second ink 320a may be applied by the first print unit 410 and the second print unit 420. After applying the first ink 310a and the second ink 320a, by subsequent processes, the first ink 310a forms a first area (refer to 300 in FIGS. 2 to 6) of the bonding layer (refer to 310 in FIGS. 2 to 6), and the second ink 320a forms a second area (refer to 320 in FIGS. 2 to 6) of the bonding layer 300.

Accordingly, the position in which the first ink 310a is dropped on the display panel 100 by the inkjet printing apparatus 400 may correspond to the position in which the first area (refer to 310 in FIGS. 2 to 6) of the bonding layer (refer to 300 in FIGS. 2 to 6) is disposed, and the position in which the second ink 320a is dropped by the inkjet printing apparatus 400 may correspond to the position in which the second area (refer to 320 in FIGS. 2 to 6) of the bonding layer (refer to 300 of FIGS. 2 to 6) is disposed. For example, the first ink 310a may be disposed in the first area 110 of the display panel 100, and the second ink 320a may be disposed in the second area 120 of the display panel 100.

In addition, the first ink 310a may include a material (e.g., the translucent resin, the photocurable resin, the photoinitiator, or the like) included in the above-described first area (refer to 310 in FIGS. 2 to 6), and the second ink 320a may include a material (e.g., the translucent resin, the photocurable resin, the photoinitiator, a dye or a pigment, or the like) included in the above-described second area (refer to 320 in FIGS. 2 to 6).

In an exemplary embodiment, the viscosity of the first ink 310a may be in a range of about 8 cP to about 20 cP. The viscosity of the second ink 320a may be greater than the viscosity of the first ink 310a. In an exemplary embodiment, the viscosity of the second ink 320a may be in a range of about 1.5 times to about 2 times the viscosity of the first ink 310a. For example, the viscosity of the second ink 320a may be in a range of about 8 cP to about 30 cP or a range of about 8 cP to about 40 cP. Accordingly, the second ink 320a may not mix with the first ink 310a applied to the periphery thereof due to the different viscosities thereof, and the boundary surface (refer to BD in FIG. 3) may be formed between the second ink 320a and the first ink 310a.

The first print unit 410 may eject different inks (e.g., the first ink 310a and the second ink 320a) on the first area 110 and second area 120. As shown in the exemplary embodiment of FIG. 7, the first print unit 410 may include a plurality of first inkjet heads 411 discharging the first ink 310a, at least one second inkjet head 412 discharging the second ink 320a, and a first print head 413.

Although exemplary embodiments of the present inventive concepts are not limited thereto, the second print unit 420 may eject one ink (e.g., the second ink 320a). As shown in the exemplary embodiment of FIG. 9, the second print unit 420 may include at least one third inkjet head 421 discharging the second ink 320a and having a second print head 422.

The first inkjet head 411, the second inkjet head 412, and the third inkjet head 421 may include a plurality of nozzles, and may be connected to a separate ink storage unit to eject a predetermined ink (e.g., the first ink 310a or the second ink 320a) on the display panel 100.

The first inkjet head 411 and the second inkjet head 412 of the first print unit 410 may be arranged along the first direction DR1. The second inkjet head 412 may be disposed outside the first inkjet head 411 based on the alignment direction (e.g., the first direction DR1). For example, the second inkjet heads 412 disposed at the outside among the plurality of first and second inkjet heads 411 and 412 may eject the second ink 320a, and the first inkjet heads 411 disposed inside of the second inkjet heads 412 may eject the first ink 310a. The first inkjet head 411 ejecting the first ink 310a and the second inkjet head 412 ejecting the second ink 320a may respectively correspond to the positions of the first area (refer to 310 in FIGS. 2 to 6) and the second area (refer to 320 in FIGS. 2 to 6) of the bonding layer (refer to 300 in FIGS. 2 to 6).

In an exemplary embodiment, the second print unit 420 may discharge only one ink. However, exemplary embodiments of the present inventive concepts are not limited thereto. The third inkjet head 421 may eject the second ink 320a. The plurality of third inkjet heads 421 may be arranged along the second direction DR2. The second ink 320a may be discharged from at least some of the third inkjet heads 421 disposed at the outside (e.g., in the second direction DR2) among the plurality of third inkjet heads 421, and the other third inkjet heads 421 disposed at the inside may eject the first ink 310a or may not eject both the first ink 310a and the second ink 320a.

The first print head 413 and the second print head 422 may be connected to moving members that are separately provided, and may move the first print unit 410 and the second print unit 420 in the first direction DR1 and the second direction DR2, respectively.

Hereinafter, the process of applying the first ink 310a and the second ink 320a will be described with reference to the exemplary embodiments of FIGS. 7 to 10.

The first print unit 410 may apply the first ink 310a and the second ink 320a while moving in the second direction DR2. While moving in the first direction DR1, the second print unit 420 may apply the second ink 320a to a partial area of the second area 120 of the display device to which the second ink 320a is not applied by the first print unit 410. However, exemplary embodiments of the present inventive concepts are not limited thereto and the second print unit 420 may apply the first ink 310a as well as the second ink 320a.

The first print unit 410 may apply the first ink 310a and the second ink 320a while moving in the second direction DR2. However, in the above process, the first print unit 410 may apply the second ink 320a to the second area 120 of the display panel 100, but may apply the second ink 320a only to a partial portion of the second area 120 and not the entire portion of the second area 120 of the display panel 100. For example, the first print unit 410 may apply the second ink 320a to partial portions of the second area 120 positioned on a first lateral side and an opposite second lateral side of the second area 120 in the first direction DR1, but may not apply the second ink 320a to partial portions of the second area 120 positioned on a first lateral side and the opposite second lateral side of the second area 120 in the second direction DR2. For example, the first print unit 410 may apply the first ink 310a and the second ink 320a, but may apply the second ink 320a only to areas adjacent to the first side and the opposite second side of the display panel 100 in the first direction DR1 during the process of applying the second ink 320a. The second ink 320a may not be applied to areas adjacent to the first side and the opposite second side of the display panel 100 in the second direction DR2.

While moving in the first direction DR1, the second print unit 420 may apply the second ink 320a to the area to which the ink is not applied by the first print unit 410. For example, the second print unit 420 may apply the second ink 320a to partial portions of the second area 120 positioned on a first lateral side and the opposite second lateral side of the second area 120 of the display panel 100 in the second direction DR2. As a result, the first print unit 410 and the second print unit 420 may together apply the first ink 310a and the second ink 320a to the entire area (e.g., the first area 110 and the second area 120 of the display panel 100) corresponding to the bonding layer (refer to 300 in FIGS. 2 to 6).

However, the method of applying the first ink 310a and the second ink 320a to the area corresponding to the bonding layer (refer to '300' in FIGS. 2 to 6) is not limited thereto. For example, when the lengths of the display panel 100 extending in the first direction DR1 and the second direction DR2 are the same, after the first ink 310a and the second ink 320a are applied by the first print unit 410 as described above, the display panel 100 may be rotated, and the second ink 320a may be applied by the first print unit 410 again as in the above-described second print unit 420. In this exemplary embodiment, the first ink 310a and the second ink 320a may be applied to the entire area corresponding to the bonding layer (refer to '300' in FIGS. 2 to 6) using only the first print unit 410.

The process of applying the first ink 310a and the second ink 320a may include pre-curing with ultraviolet irradiation. While following the first print unit 410 and the second print unit 420 as they are moved by moving members, a pre-curing module which may also be moved by moving members may irradiate the first ink 310a and the second ink 320a applied to the display panel 100 with ultraviolet light. The first ink 310a and the second ink 320a applied to the display panel 100 may be partially cured by ultraviolet irradiation to prevent the first ink 310a and the second ink 320a from flowing to an undesired area.

Hereinafter, the process of forming the bonding layer 300 including the first area 310 and the second area 320 with the first ink 310a and the second ink 320a applied to the display panel 100 through the vacuum surface bonding process will be described with reference to FIGS. 11 to 14.

Figure 11:
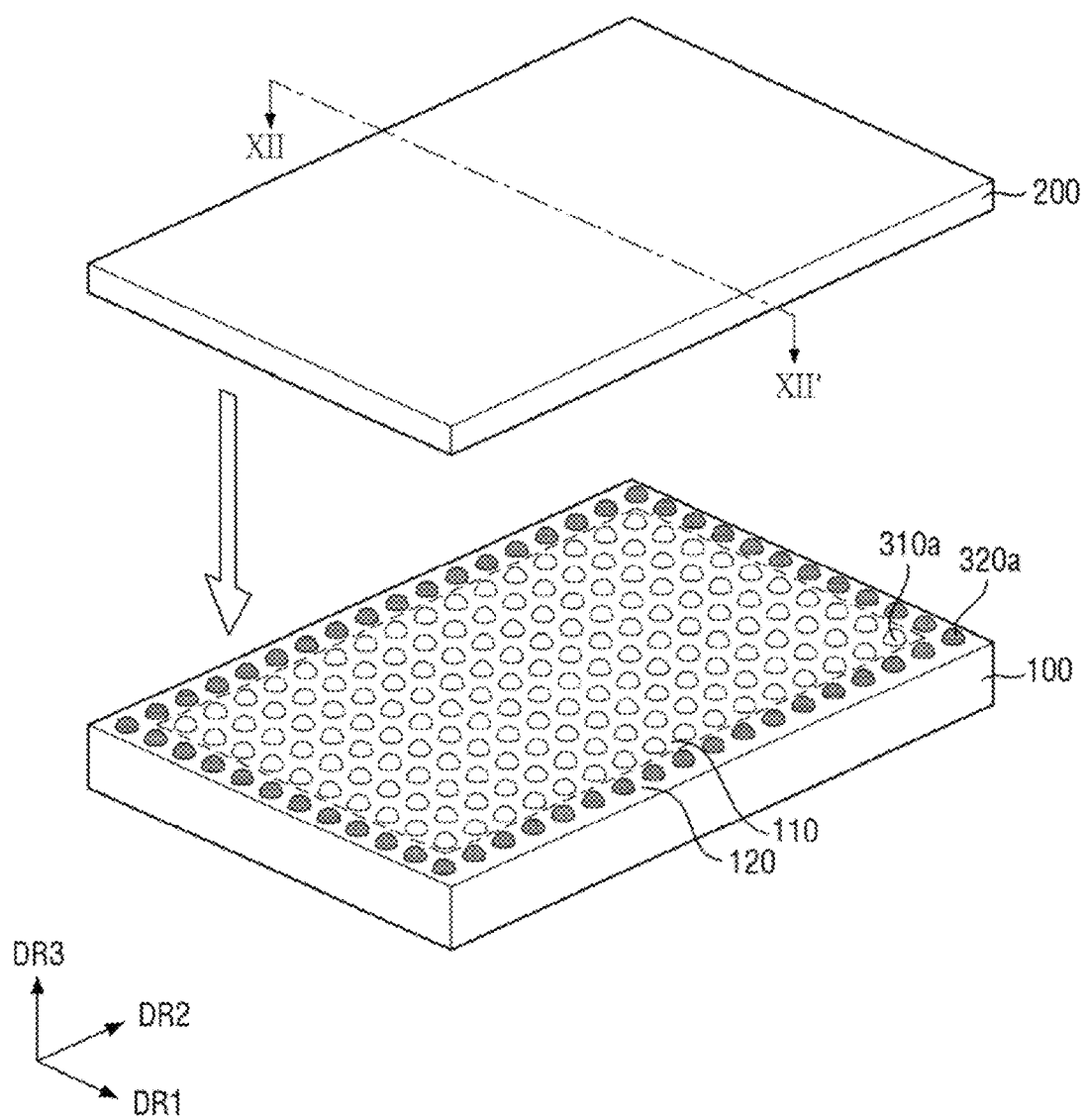
FIG. 11 is a perspective view illustrating a state in which a protection member descends above the display panel to which the first ink and the second ink are applied according to an exemplary embodiment of the present inventive concepts.
Figure 12:
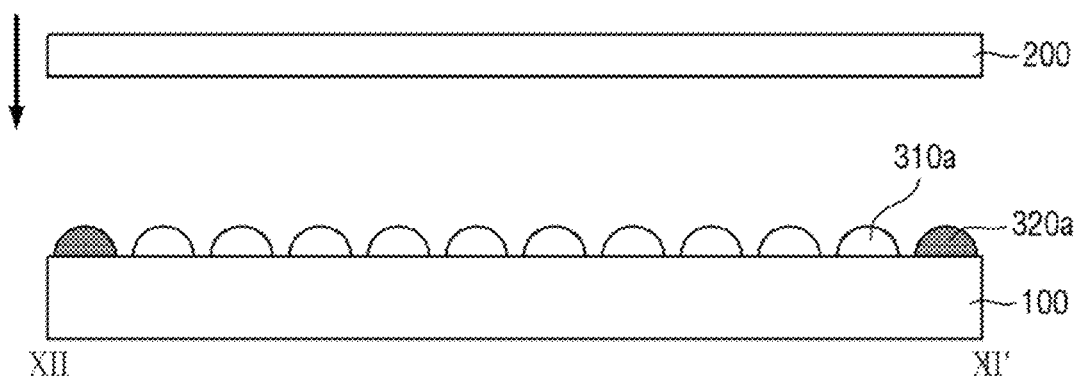
FIGS. 12 to 14 are cross-sectional views taken along line XII-XII' of FIG. 11 according to exemplary embodiments of the present inventive concepts.
Figure 13:
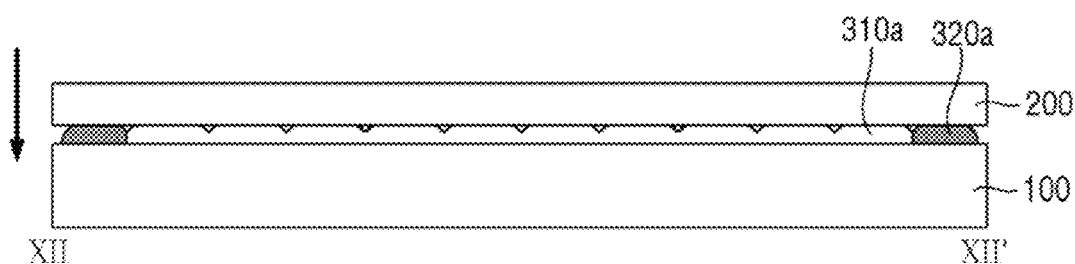
Figure 14:
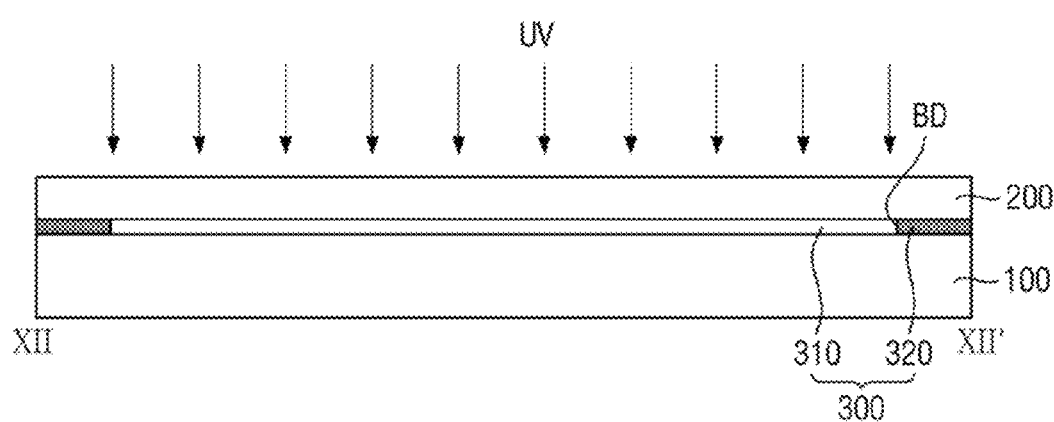

FIG. 11 is a view illustrating a state in which a protection member descends above the display panel to which the first ink and the second ink are applied. FIGS. 12 to 14 are cross-sectional views taken along line XII-XII' of FIG. 11. FIGS. 12 to 14 illustrate the appearances of the first ink 310a and the second ink 320a that change as the protection member 200 descends.

Referring to FIGS. 11 to 14, the protection member 200 may descend above display panel 100 to which the first ink 310a and the second ink 320a are applied, and the bonding layer 300 may be formed when the first ink 310a and the second ink 320a are pressed by the protection member 200 disposed thereon.

As the protection member 200 descends above the display panel 100, the first ink 310a and the second ink 320a applied to the display panel 100 (e.g., in the form of drops) come into contact with the bottom surface of the protection member 200. Thereafter, as the protection member 200 continues to descend, the thickness (e.g., length in the third direction DR3) of the first ink 310a and the second ink 320a may decreases and the first ink 310a and the second ink 320a may spread out to the vicinity (e.g., in the first and/or second directions DR1, DR2). That is, the thickness (e.g., length in the third direction DR3) of the first ink 310a and the second ink 320a may decrease, but the area of the top surface of the display panel 100 (e.g., in a plane defined in the first and second directions DR1, DR2), which is covered by the first ink 310a and the second ink 320a, may increase. As a result, the first ink 310a and the second ink 320a may cover all areas or most areas of the top surface of the display panel 100. Thus, the first ink 310a may form the first area 310 of the bonding layer 300, and the second ink 320a may form the second area 320 of the bonding layer 300.

In the above process, drops of the first ink 310a may be mixed and mutually bonded with other drops of the first ink 310a nearby, and a physical boundary may not be formed between the plurality of drops of the first ink 310a. However, the second ink 320a may have a different viscosity and/or a different photoinitiator concentration from the first ink 310a, and accordingly, the second ink 320a and the first ink 310a may not be mixed with each other and the boundary surface BD may be formed between the second ink 320a and the first ink 310a.

In an exemplary embodiment, the first ink 310a and the second ink 320a may cover an entire portion or a majority of the top surface of the display panel 100. After the above-described process in which the first area 310 and the second area 320 of the bonding layer 300 are formed by disposing the protection member 200 thereon, the entire portion of the bonding layer 300 is irradiated with ultraviolet light by a separately provided ultraviolet irradiation module. Then, the bonding layer 300 is completely cured, and the forming of the bonding layer 300 is completed.

According to the display device (refer to 10 in FIG. 1) and/or the method of manufacturing the bonding layer 300 according to an exemplary embodiment as described above, different types of inks (e.g., the first ink 310a and the second ink 320a) may be applied in one process by an inkjet printing method. In addition, the ability of the second area 320 to block light emitted from the display panel 100 may be formed in the process of forming the bonding layer 300 that bonds the protection member 200 and the display panel 100.

Accordingly, the thickness (e.g., length in the third direction DR3, refer to TH3 in FIG. 15) of the printed layer (refer to BM_1, BM_2 in FIGS. 15 and 16) disposed on the protection member 200 may decrease, or the printed layer (refer to BM_1, BM_2 in FIGS. 15 and 16) itself may be unnecessary. Accordingly, it is possible to prevent or suppress air bubbles and gap phenomena that may occur in a step between the printed layer (refer to BM_1, BM_2 in FIGS. 15 and 16) and the protection member 200, thereby improving process reliability. In addition, the process of forming the printed layer (refer to BM_1, BM_2 in FIGS. 15 and 16) may be omitted, so that the process efficiency may increase, the cost that is necessary for manufacturing the display device (refer to 10 in FIG. 1) may be reduced, the thickness of the bonding layer 300 may decrease, and the thickness of the display device (refer to 10 in FIG. 1) may decrease.

In addition, in the above description, the application of the first ink 310a and the second ink 320a to the display panel 100 has been described. However, exemplary embodiments of the present inventive concepts are not limited thereto. For example, in another exemplary embodiment, the first ink 310a and the second ink 320a may be applied to the protection member 200 instead of the display panel 100 and a vacuum surface bonding process may be performed using the display panel 100. For example, in exemplary embodiments, the application of the first ink 310a and the second ink 320a is performed on a first substrate that may be either the display panel 100 or the protection member 200 and then a second substrate which is the other of the display panel 100 or the protection member 200 is disposed and pressed on the first substrate having the first ink 310a and second ink 320a applied thereto. The first ink 310a and the second ink 320a are then cured to bond the first substrate and the second substrate to each other.

Hereinafter, other exemplary embodiments of the display device and a method of manufacturing the display device will be described. In the following exemplary embodiments, a description of identical or substantially identical elements as those of the above-described exemplary embodiments will be omitted or simplified, and differences will be mainly described for convenience of explanation.

First, a display device according to other exemplary embodiments will be described.

Figure 15:
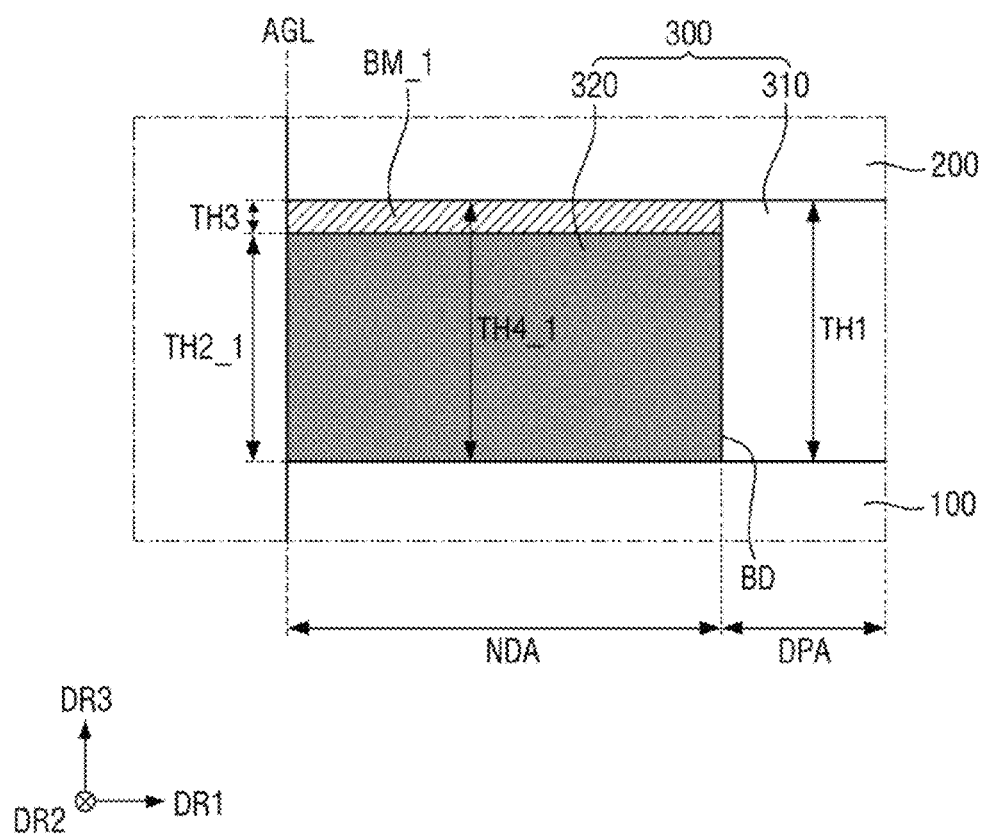
FIG. 15 is a partial cross-sectional view of a display device according to another exemplary embodiment of the present inventive concepts.

FIG. 15 is a partial cross-sectional view of a display device according to another exemplary embodiment.

Referring to the exemplary embodiment of FIG. 15, the protection member 200 differs from the exemplary embodiment of FIG. 3 in that the protection member 200 further includes a printed layer BM_1.

As shown in the exemplary embodiment of FIG. 15, the protection member 200 may further include the printed layer BM_1 disposed in the edge area. The printed layer BM_1 is disposed in the non-display area NDA. The printed layer BM_1 may be an edge coating layer. The printed layer BM_1 may be disposed on an upper surface of the second area 320. For example, a lower surface of the printed layer BM_1 may directly contact an upper surface of the second area 320. The printed layer BM_1 may be an outermost black matrix layer and/or a decorative layer that imparts an aesthetic appeal. The printed layer BM_1 may distinguish the display area DPA and the non-display area NDA. For example, an inner side of the printed layer BM_1 may be a boundary between the display area DPA and the non-display area NDA. The printed layer BM_1 may overlap the second area 320 of the bonding layer 300 (e.g., in the third direction DR3). The inner surface of the printed layer BM_1 may be aligned with the inner surface of the second area 320. An outer lateral side of the printed layer BM_1 may be aligned with the outer lateral side surface of the protection member 200. However, exemplary embodiments of the present inventive concepts are not limited thereto. For example, in an exemplary embodiment, the outer side of the printed layer BM_1 may be located more inward than the lateral side surface of the protection member 200.

The printed layer BM_1 may be disposed on the bottom surface of the protection member 200. For example, an upper surface of the printed layer BM_1 may directly contact the bottom surface of the protection member 200. The printed layer BM_1 may be disposed on the surface of the protection member 200, but may also be disposed inside the protection member 200. For example, as will be described later, the protection member 200 may include several layers. In this exemplary embodiment, not only the outermost layer, but an intermediate layer may also be selected as a layer on which the printed layer BM_1 is coated.

The thickness TH3 (e.g., length in the third direction DR3) of the printed layer BM_1 may be in a range of about 10 μm or less, or about 20 μm or less. A thickness TH2_1 of the second area 320 may be smaller than the thickness TH1 of the first area 310. For example, the thickness TH2_1 of the second area 320 may be smaller than the thickness TH1 of the first area 310 in an amount equal to the thickness TH3 of the printed layer BM_1. Therefore, a thickness TH4_1 that is the sum of the thickness TH2_1 of the second area 320 and the thickness TH3 of the printed layer BM_1 may be substantially equal to the thickness TH1 of the first area 310.

In the exemplary embodiment of FIG. 15, the second area 320 may still be formed in the process of forming the bonding layer 300 that bonds the protection member 200 and the display panel 100 to each other. Accordingly, as described above, it is possible to increase process reliability and process efficiency, reduce cost, and reduce the thickness of the display device (refer to 10' in FIG. 1). In addition, since the printed layer BM_1 is additionally disposed in the non-display area NDA, the light blocking rate in the non-display area NDA may be increased.

Figure 16:
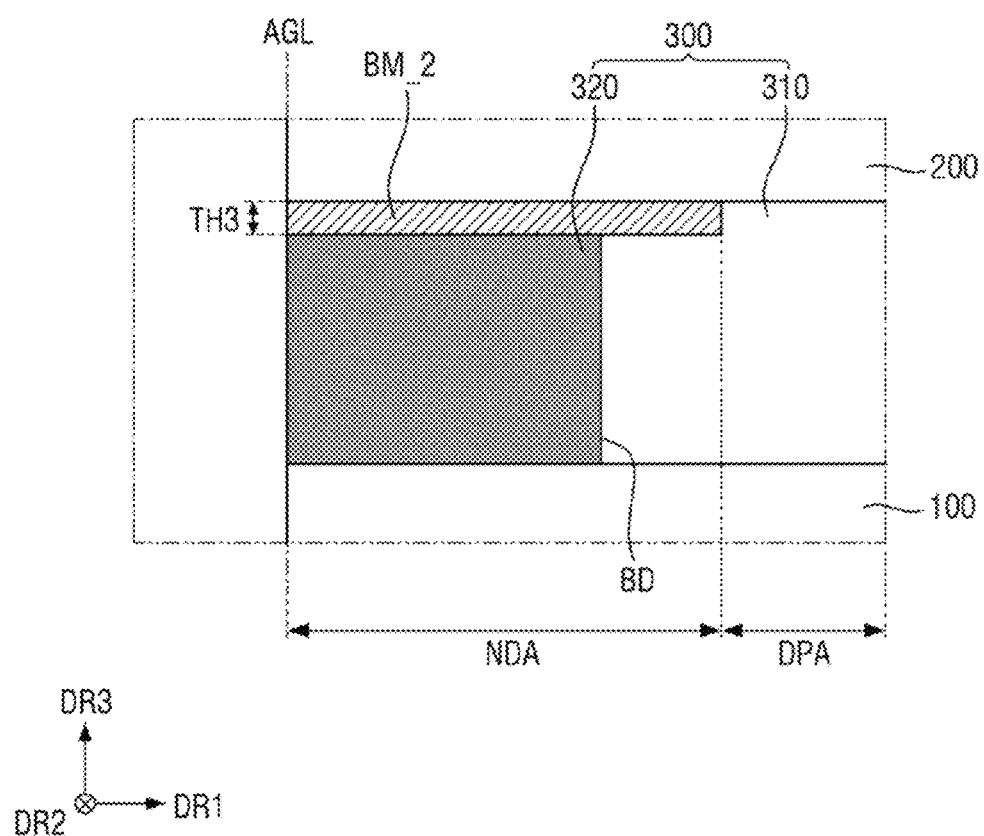
FIG. 16 is a partial cross-sectional view of a display device according to still another exemplary embodiment of the present inventive concepts.

FIG. 16 is a partial cross-sectional view of a display device according to still another exemplary embodiment of the present inventive concepts.

Referring to FIG. 16, the present exemplary embodiment differs from the exemplary embodiment of FIG. 15 in that the inner surface of the printed layer BM_2 and the inner surface of the second area 320 are not aligned with each other.

For example, the protection member 200 according to the present exemplary embodiment may include the printed layer BM_2, but the inner surface of the printed layer BM_2 and the inner surface of the second area 320 are not aligned with each other. For example, the lateral side surface of the second area 320 closest to the display area DPA may be disposed farther from the display area DPA than the lateral side surface of the printed layer BM_2 closest to the display area DPA. That is, a portion of the printed layer BM_2 may protrude inward compared to the inner surface of the second area 320. At least a partial portion of the second area 320 may overlap the printed layer BM_2. A portion of the printed layer BM_2 which protrudes inwardly compared to the inner surface of the second area 320 may extend past the boundary surface BD and may overlap the first area 310 (e.g., in the third direction DR3).

In the exemplary embodiment of FIG. 16, the second area 320 may still be formed in the process of forming the bonding layer 300 that bonds the protection member 200 and the display panel 100. Accordingly, as described above, it is possible to increase process reliability and process efficiency, reduce cost, and reduce the thickness of the display device (refer to '10' in FIG. 1). In addition, as the printed layer BM_2 is additionally disposed in the non-display area NDA, the light blocking rate in the non-display area NDA may be increased.

Figure 17:
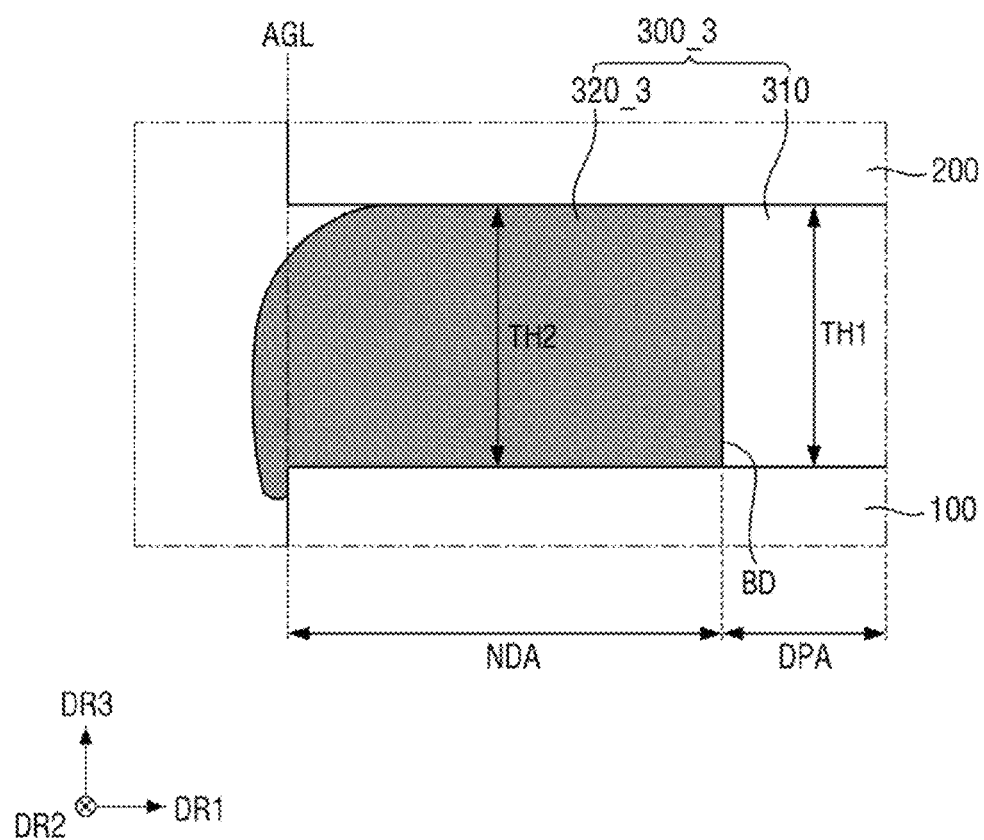
FIG. 17 is a partial cross-sectional view of a display device according to still another exemplary embodiment of the present inventive concepts.

FIG. 17 is a partial cross-sectional view of a display device according to still another exemplary embodiment.

Referring to FIG. 17, the present exemplary embodiment differs from the exemplary embodiment of FIG. 3 in that a portion of a second area 320_3 covers at least a partial portion of the outer surface of the display panel 100.

The outer surface of the second area 320_3 according to the present exemplary embodiment may not be aligned with the alignment plane AGL and may protrude outwardly with respect to the alignment plane GL to cover at least a partial portion of the outer surface of the display panel 100. In this exemplary embodiment, the outer surface of the second area 320_3 may not be aligned with the outer surface of the protection member 200 and the outer surface of the display panel 100.

In the above-described process, the second ink (refer to 320a in FIGS. 7 to 13) may flow out of the display panel 100 and cover a portion of the outer surface of the display panel 100. In this state, the second ink 320a may be cured due to ultraviolet irradiation. Accordingly, the second area 320_3 may cover a portion of the outer surface of the display panel 100. In addition, in the third direction DR3, an empty space may be positioned between a partial portion of the bottom surface of the protection member 200 and the second area 320_3. For example, an empty space is formed between an outer lateral edge of the bottom surface of the protection member 200 and the upper surface of the second area 320_3 overlapping thereto.

In the exemplary embodiment of FIG. 17, the second area 320_3 may still be formed in the process of forming the bonding layer 300 that bonds the protection member 200 and the display panel 100. Accordingly, as described above, it is possible to increase process reliability and process efficiency, reduce cost, and reduce the thickness of the display device (refer to 10 in FIG. 1).

Figure 18:
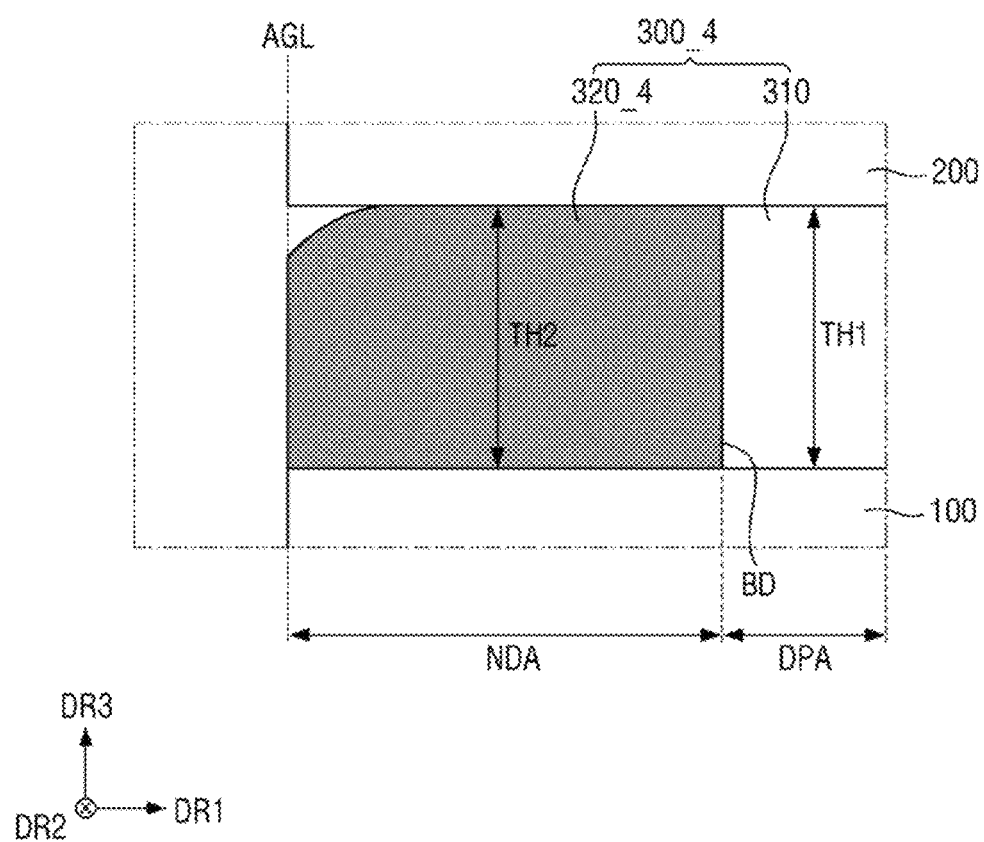
FIG. 18 is a partial cross-sectional view of a display device according to still another exemplary embodiment of the present inventive concepts.

FIG. 18 is a partial cross-sectional view of a display device according to still another exemplary embodiment.

Referring to FIG. 18, the present exemplary embodiment differs from the exemplary embodiment of FIG. 17 in that the outer surface of the second area 320_4 may be aligned with the alignment plane AGL.

For example, an empty space may be positioned between the second area 320_4 and a partial portion of the bottom surface of the protection member 200. For example, an empty space is formed between an outer lateral edge of the bottom surface of the protection member 200 and the upper surface of the second area 320_4 overlapping thereto. However, the outer surface of the second area 320_4 may be aligned with the alignment plane AGL. That is, the outer surface of the second area 320_4 may be aligned with the outer surface of the protection member 200 (e.g., an outer lateral edge of the protection member 200) and the outer surface of the display panel 100.

The outer surface of the second area 320_4 according to the exemplary embodiment of FIG. 18 may be formed by cutting or scribing the second area 320_3 of the exemplary embodiment of FIG. 17 (refer to 320_3 of FIG. 17) along the alignment plane AGL.

In the exemplary embodiment of FIG. 18, the second area 320_4 may still be formed in the process of forming the bonding layer 300 that bonds the protection member 200 and the display panel 100. Accordingly, as described above, it is possible to increase process reliability and process efficiency, reduce cost, and reduce the thickness of the display device (refer to 10 in FIG. 1).

Figure 19:
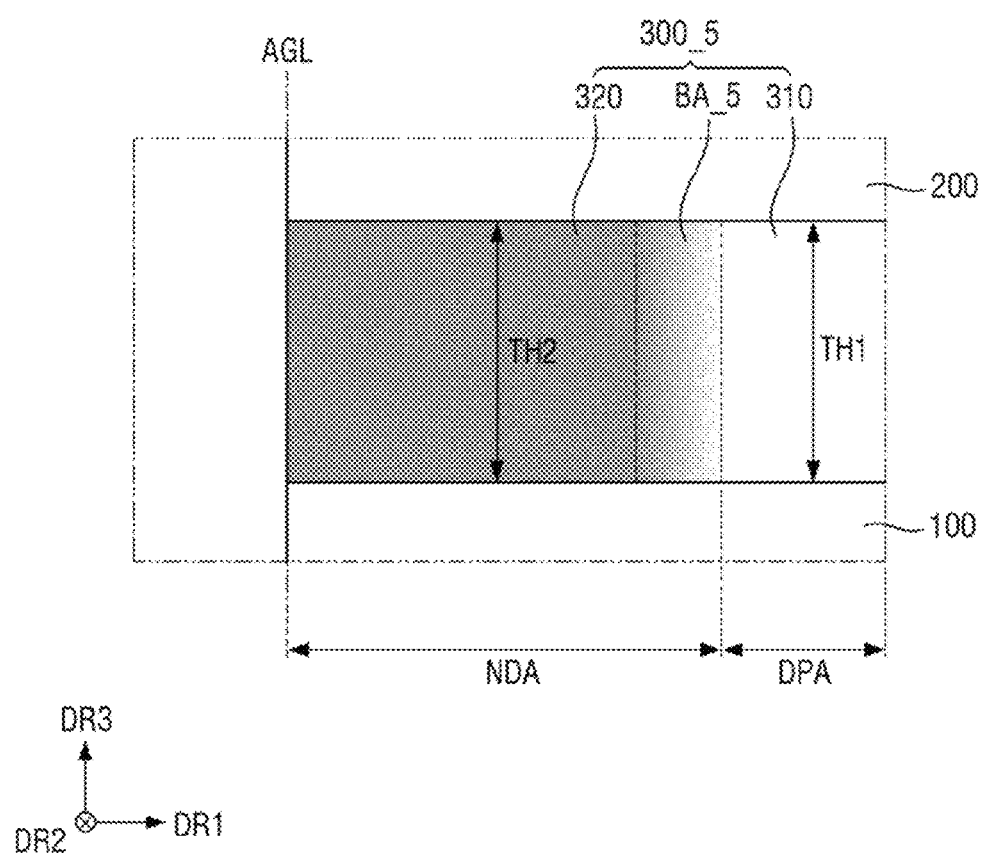
FIG. 19 is a partial cross-sectional view of a display device according to still another exemplary embodiment of the present inventive concepts.

FIG. 19 is a partial cross-sectional view of a display device according to still another exemplary embodiment of the present inventive concepts.

Referring to FIG. 19, the present exemplary embodiment differs from the exemplary embodiment of FIG. 3 in that a bonding layer 300_5 further includes a boundary area BA_5 between the first area 310 and the second area 320 (e.g., in the first direction DR1).

For example, the bonding layer 300_5 according to the present exemplary embodiment may include the first area 310 and the second area 320, but the boundary area BA_5 may be further included between the first area 310 and the second area 320 (e.g., in the first direction DR1).

The boundary area BA_5 may be disposed in the non-display area NDA. In an exemplary embodiment, the boundary area BA_5 may be formed by the first ink (refer to 310a in FIGS. 7 to 13) and the second ink (refer to 320a in FIGS. 7 to 13) being partially mixed in the above-described process. As shown in the exemplary embodiment of FIG. 19, a gradation phenomenon may occur in the boundary area BA_5. For example, when the first ink (refer to 310a in FIGS. 7 to 13) and the second ink (refer to 320a in FIGS. 7 to 13) are partially mixed, a portion of the dye or the pigment included in the second ink (refer to 320a in FIGS. 7 to 13) may escape to the outside of the second ink (refer to 320a in FIGS. 7 to 13). Accordingly, the boundary area BA_5 may include the dye or the pigment.

The concentration of the dye or the pigment in the boundary area BA_5 may decrease as the distance from the second area 320 increases. Accordingly, the light blocking rate of the boundary area BA_5 may decrease in a direction going from the second area 320 towards the first area 310. Alternatively, the boundary area BA_5 may have a third light transmittance, and the third light transmittance of the boundary area BA_5 may increase in a direction going from the second area 320 towards the first area 310 within the boundary area BA_5. Likewise, the third light transmittance may decrease as the distance to the second area decreases. For example, an area in which a light blocking rate or a light transmittance changes may be disposed between the first area 310 and the second area 320. The third light transmittance of the boundary area BA_5 may be greater than the light transmittance of the second area 320 and less than the light transmittance of the first area 310.

In the exemplary embodiment of FIG. 19, the second area 320 may still be formed in the process of forming the bonding layer 300 that bonds the protection member 200 and the display panel 100. Accordingly, as described above, it is possible to increase process reliability and process efficiency, reduce cost, and reduce the thickness of the display device (refer to 10 in FIG. 1).

Figure 20:
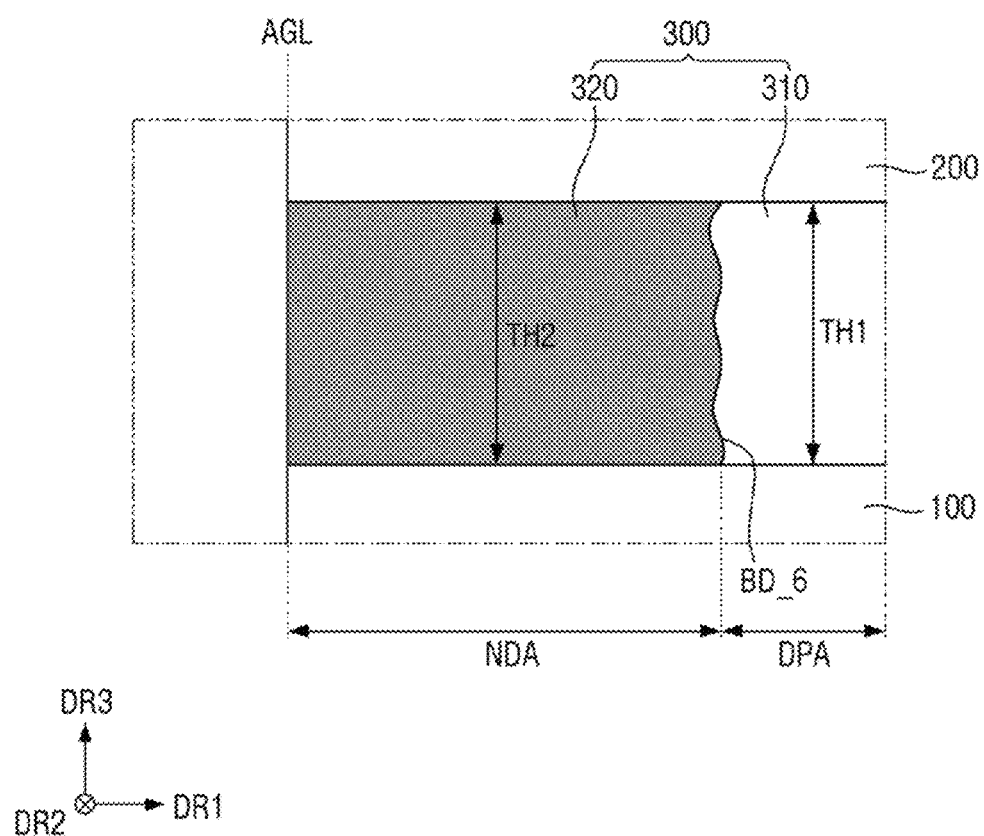
FIG. 20 is a partial cross-sectional view of a display device according to still another exemplary embodiment of the present inventive concepts.

FIG. 20 is a partial cross-sectional view of a display device according to still another exemplary embodiment of the present inventive concepts.

Referring to FIG. 20, the present exemplary embodiment differs from the exemplary embodiment of FIG. 3 in that a boundary surface BD_6 between the first area 310 and the second area 320 has at least a partial area in cross-sectional view that is not perpendicular to the display panel 100 and/or the protection member 200. For example, the boundary surface BD_6 does not extend linearly substantially in the third direction DR3.

For example, the first area 310 and the second area 320 according to the present exemplary embodiment may include the boundary surface BD_6 therebetween (e.g., in the first direction DR1). However, at least a partial portion of the boundary surface BD_6 in a cross-sectional view may not be perpendicular to the display panel 100 and/or the protection member 200, such as an upper surface of the display panel 100 and/or the protection member 200. For example, at least a partial portion of the boundary surface BD_6 may extend in a direction inclined with respect to the third direction DR3 in a cross-sectional view. That is, at least a partial portion of the boundary surface BD_6 may be formed to be inclined with respect to the third direction DR3 in a cross-sectional view. Accordingly, partial portions of the first area 310 and the second area 320 may overlap in the thickness direction (the third direction DR3).

In addition, the boundary surface BD_6 may be formed in a curved shape at least partially in a cross-sectional view. The curved shape of the at least partial portion of the boundary surface BD_6 may include, a convex shape toward the outside of the display device, a concave shape toward the inside thereof, and/or a shaped formed as a combination thereof, or the like. However, exemplary embodiments of the present inventive concepts are not limited thereto. Accordingly, the boundary surface BD_6 may include at least one inflection point in cross-sectional view.

In the exemplary embodiment of FIG. 20, the second area 320 may still be formed in the process of forming the bonding layer 300 that bonds the protection member 200 and the display panel 100. Accordingly, as described above, it is possible to increase process reliability and process efficiency, reduce cost, and reduce the thickness of the display device (refer to 10 in FIG. 1).

Hereinafter, a method of manufacturing a display device according to other exemplary embodiments will be described.

Figure 21:
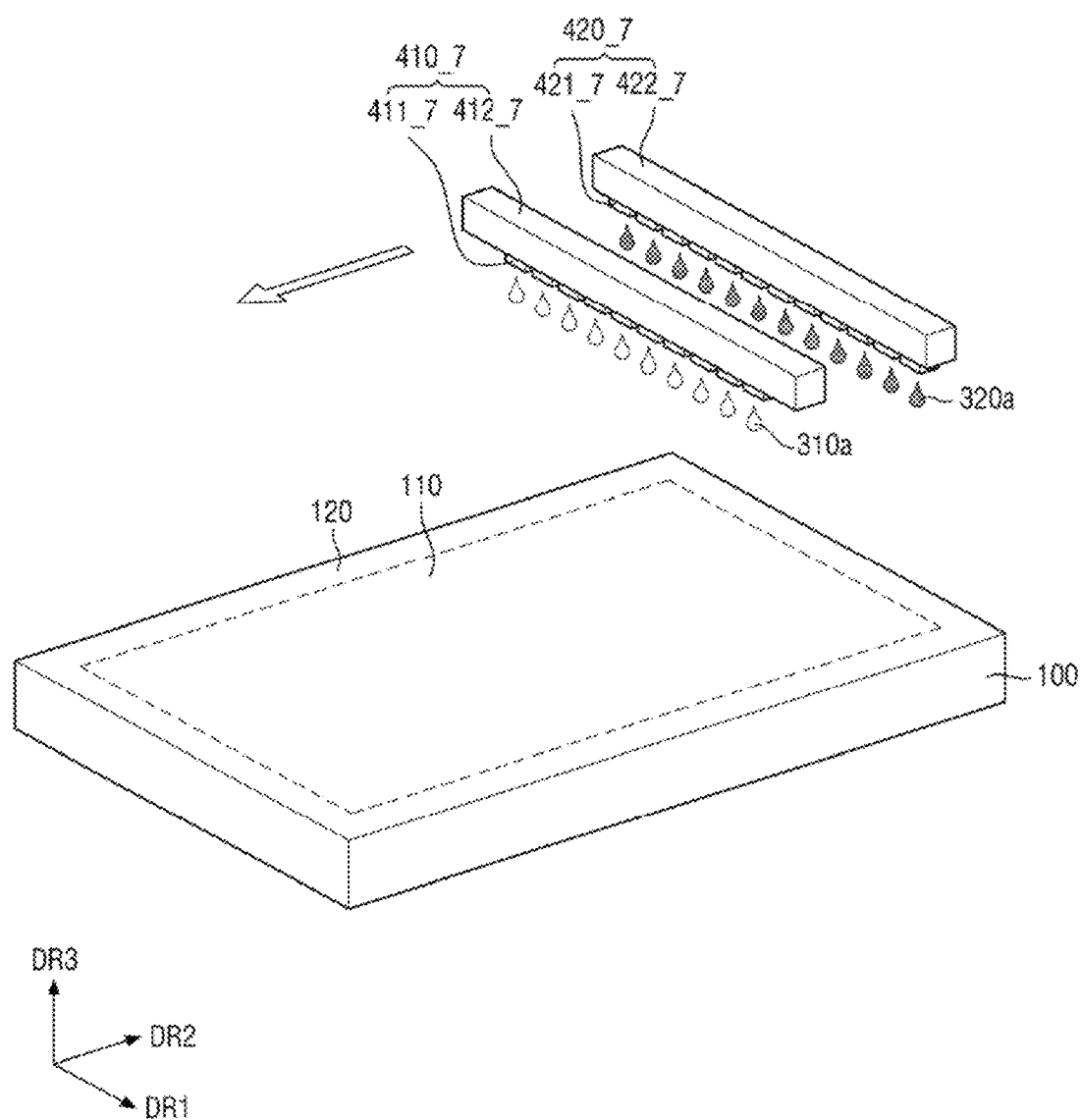
FIG. 21 is a perspective view schematically illustrating a method of manufacturing a display device according to another exemplary embodiment of the present inventive concepts.
Figure 22:
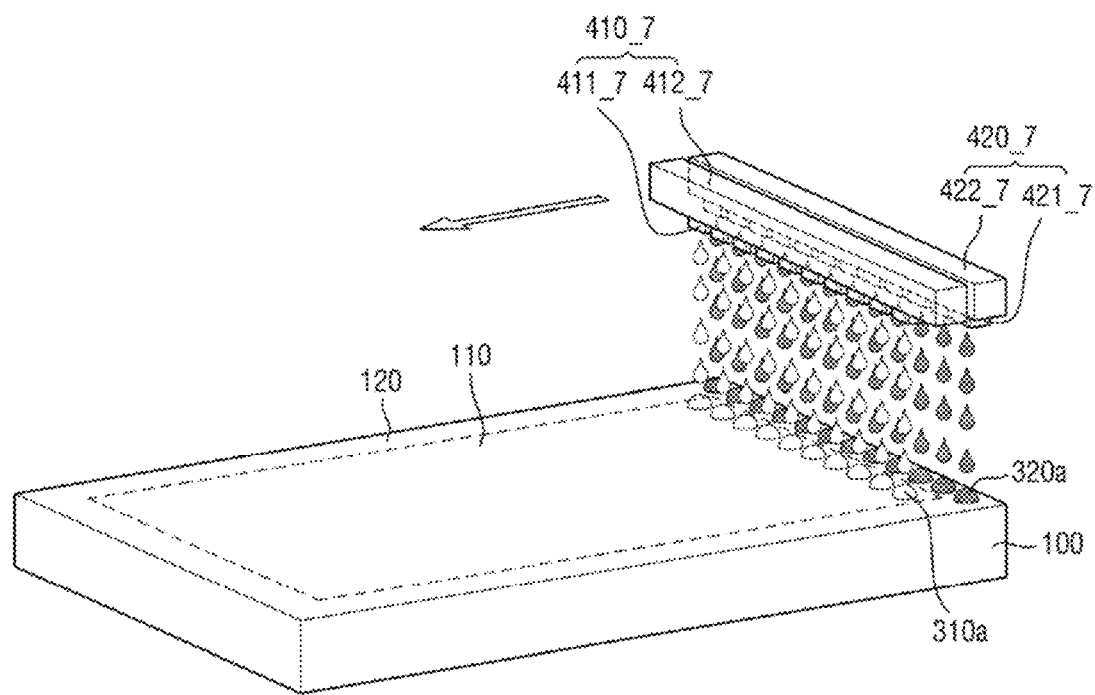
FIGS. 22 to 24 are perspective views illustrating steps of applying the first ink and the second ink according to the method of manufacturing the display device according to other exemplary embodiments of the present inventive concepts.
Figure 23:
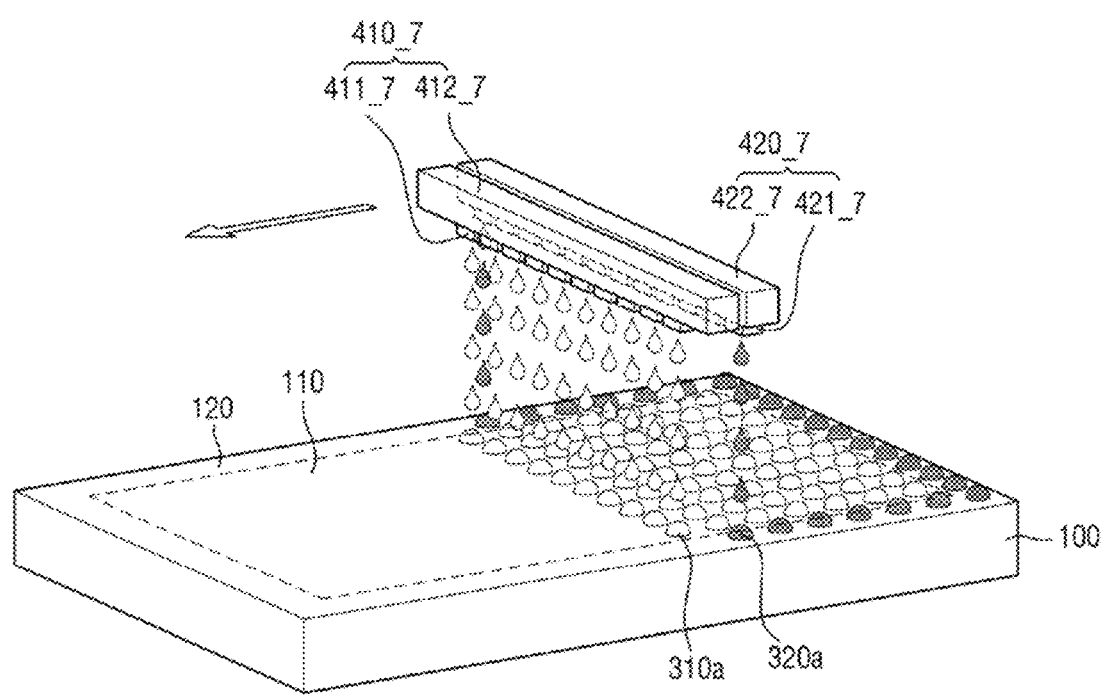
Figure 24:
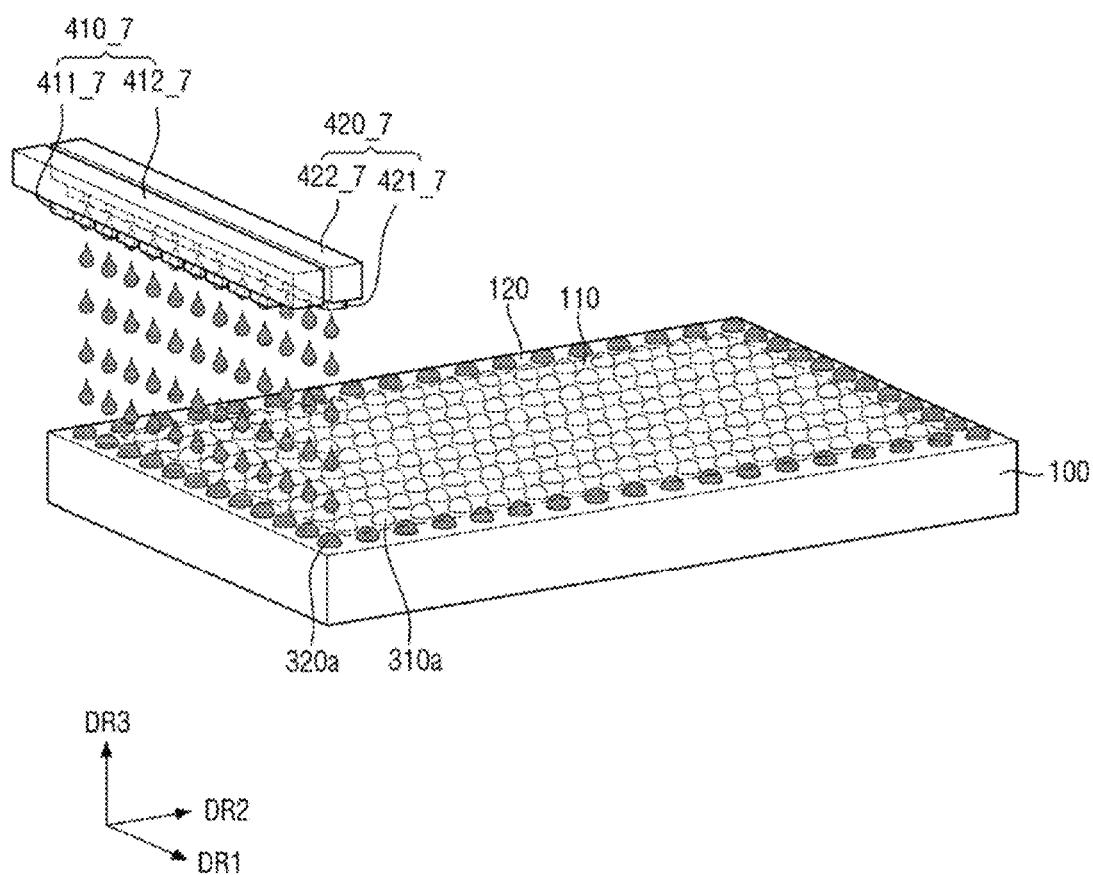

FIG. 21 is a perspective view schematically illustrating a method of manufacturing a display device according to another exemplary embodiment. FIGS. 22 to 24 are perspective views illustrating steps of applying the first ink and the second ink according to the method of manufacturing the display device according to another exemplary embodiment of the present inventive concepts. Hereinafter, directions in which a first print unit 410_7 and a second print unit 420_7 move are referred to as in a direction towards a second lateral side of the display device in the second direction DR2.

Referring to FIG. 21, the method of manufacturing the display device according to the present exemplary embodiment is different from the exemplary embodiment illustrated in FIGS. 7 to 14 in that the first print unit 410_7 and the second print unit 420_7 travel in the same direction.

For example, in the method of manufacturing the display device according to the present exemplary embodiment, the first print unit 410_7 may include a plurality of first inkjet heads 411_7 and a first print head 412_7, and the second print unit 420_7 may include a plurality of second inkjet heads 421_7 and a second print head 422_7. The plurality of first inkjet heads 411_7 and the plurality of second inkjet heads 421_7 may be arranged in the first direction DR1, respectively.

The first print unit 410_7 and the second print unit 420_7 may travel in the same direction. For example, although exemplary embodiments of the present inventive concepts are not limited thereto, the first print unit 410_7 and the second print unit 420_7 may travel in the second direction DR2. For example, the first print unit 410_7 and the second print unit 420_7 may be initially positioned on or adjacent to a first lateral side of the display device in the second direction DR2 and may travel in the second direction DR2 towards the opposite second lateral side the display device in the second direction DR2. The traveling direction of the first and second print units 410_7, 420_7 may be an opposite direction that the directional arrow for the second direction DR2 points in FIG. 21. The second print unit 420_7 may follow the first print unit 410_7 in the traveling direction (e.g., towards the second lateral side of the display device in the second direction DR2). That is, the second print unit 420_7 may be positioned on a first lateral side of the first print unit 410_7 in the second direction DR2. However, exemplary embodiments of the present inventive concepts are not limited thereto.

The first print unit 410_7 may eject the first ink 310a from all of the first inkjet heads 411_7, and the second print unit 420_7 may eject the second ink 320a from all the second inkjet heads 421_7. However, the exemplary embodiments of the present inventive concepts are not limited thereto, and the first print unit 410_7 may eject both the first ink 310a and the second ink 320a as in the exemplary embodiments of FIGS. 7 to 14.

Referring further to FIG. 22, when the second ink 320a is applied to the second area 120 of the display panel 100, which is disposed on a first lateral side of the display device (refer to 10 in FIG. 1) in the second direction DR2 and extends in the first direction DR1, corresponding to the second area (refer to 320 in FIGS. 2 to 14) of the bonding layer (refer to 300 in FIGS. 2 to 14), the second ink 320a may be ejected from at least a majority of the second inkjet heads 422_7 of the second print unit 420_7. At the same time, the first ink 310a from the first print unit 410_7 may be ejected on the first area 110 of the display panel 100 corresponding to the first area (refer to 310 in FIGS. 2 to 14) of the bonding layer (refer to 300 in FIGS. 2 to 14). However, exemplary embodiments of the present inventive concepts are not limited thereto, and depending on the distance between the first print unit 410_7 and the second print unit 420_7, the width of the area to which the second ink 320a is applied in the second direction DR2, the sizes of the first ink 310a and the second ink 320a, or the like, the first ink 310a may be ejected earlier or later than the second ink 320a.

Referring further to the exemplary embodiment of FIG. 23, the first print unit 410_7 may eject the first ink 310a while moving in the direction towards the second lateral side of the display device in the second direction DR2. In this process, the second print unit 420_7 may eject the second ink 320a only from some of second inkjet heads 422_7 positioned at a first lateral end and an opposite second lateral end in the first direction DR1. Accordingly, the second ink 320a may be ejected on the second area 120 of the display panel 100 positioned adjacent to first and second lateral sides (e.g., in the first direction DR1) of the first area 110 of the display panel 100.

Referring to the exemplary embodiment of FIG. 24, when the second ink 320a is applied to the second area 120 of the display panel 100, which is disposed on the second lateral side of the display device (refer to 10 in FIG. 1) in the second direction DR2 and extends in the first direction DR1, the second ink 320a may be ejected from at least a majority of the second inkjet heads 422_7 of the second print unit 420_7. In this case, the first print unit 410_7 may not eject the first ink 310a.

Since the subsequent processes have already been described, a duplicate description is omitted.

In the exemplary embodiments of FIGS. 21-24, the second area (refer to 320 in FIGS. 2 to 6) of the bonding layer (refer to 300 in FIGS. 2 to 6) may still be formed during the process of forming the bonding layer (refer to 300 in FIGS. 2 to 6) that bonds the protection member 200 and the display panel 100. Accordingly, as described above, it is possible to increase process reliability and process efficiency, reduce cost, and reduce the thickness of the display device (refer to 10 in FIG. 1).

Hereinafter, a display device 10_8 and a method of manufacturing the display device 10_8 according to still another exemplary embodiment will be described with reference to FIGS. 25 to 30.

Figure 25:
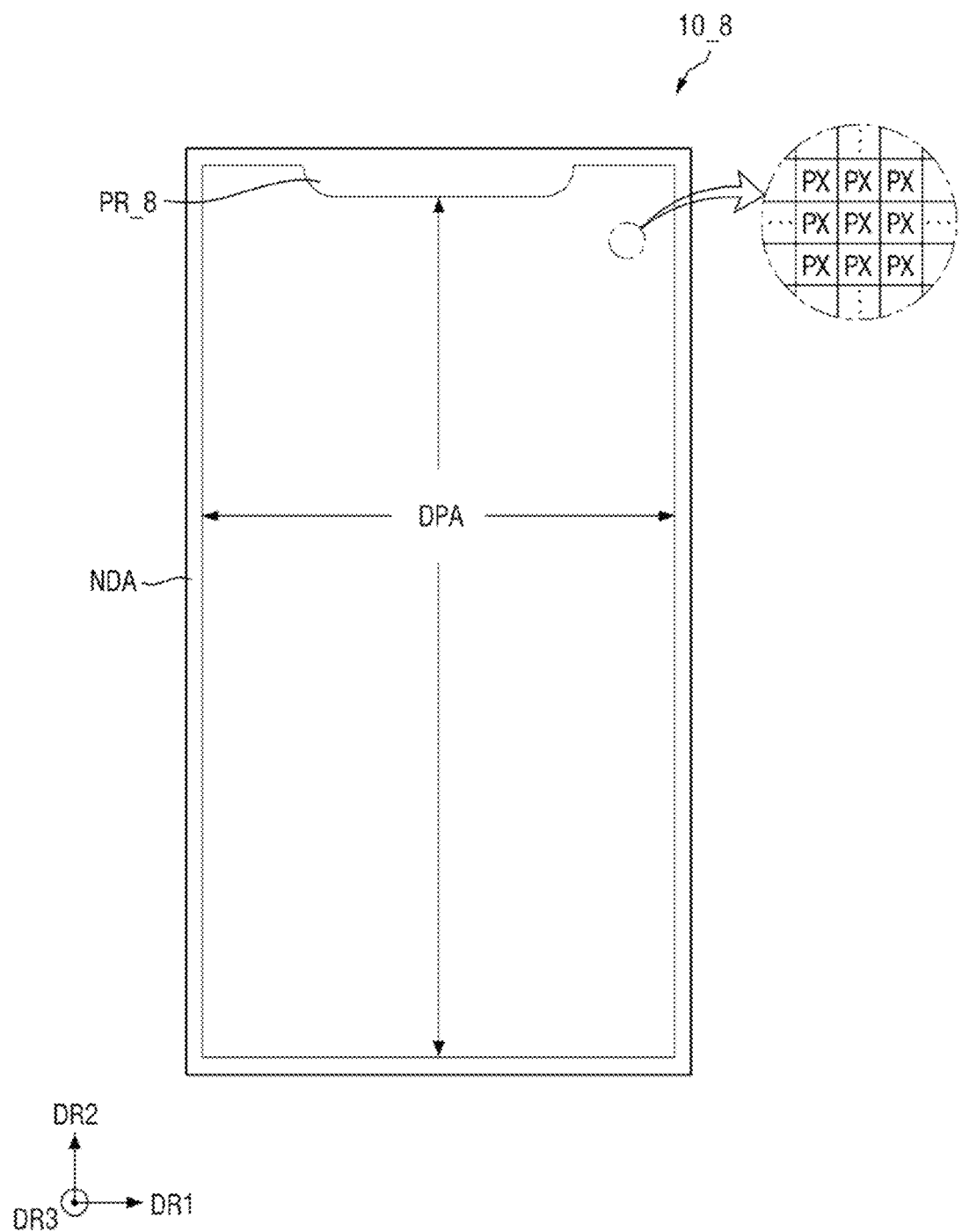
FIG. 25 is a plan view of a display device according to still another exemplary embodiment of the present inventive concepts.
Figure 26:
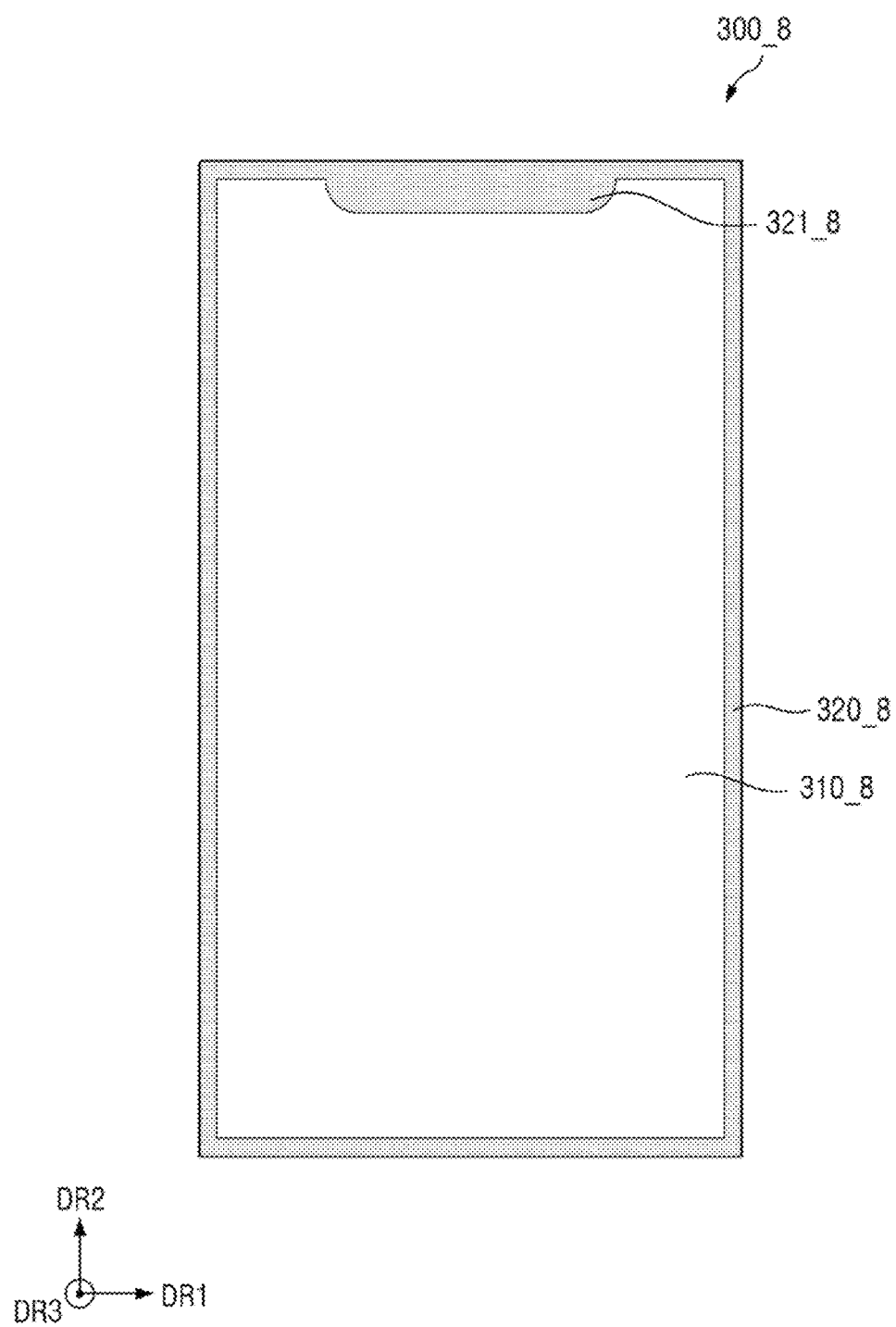
FIG. 26 is a plan view of a bonding layer according to still another exemplary embodiment of the present inventive concepts.

FIG. 25 is a plan view of a display device according to still another exemplary embodiment. FIG. 26 is a plan view of a bonding layer according to still another exemplary embodiment. FIGS. 27 to 30 are views illustrating steps of applying the first ink and the second ink according to the method of manufacturing the display device according to still another exemplary embodiment. The direction in which a first print unit 410_8 and a second print unit 420_8 move is referred to as a direction towards the second lateral side of the display device in the second direction DR2.

First, referring to FIGS. 25 and 26, the display device 10_8 according to the present exemplary embodiment differs from the embodiment of FIGS. 1 to 6 in that the non-display area NDA includes a non-display area protrusion PR_8 and a second area 320_8 of a bonding layer 300_8 according to the present exemplary embodiment includes a second area protrusion 321_8 corresponding to the non-display area protrusion PR_8.

For example, the display device 10_8 according to the present exemplary embodiment may further include the non-display area protrusion PR_8. The non-display area protrusion PR_8 is an area in which an image is not displayed. The non-display area protrusion PR_8 may be formed to protrude from the non-display area NDA positioned on a first lateral side (e.g., the upper lateral side in the second direction DR2 in a plan view in a plane defined in the first and second directions DR1, DR2) towards the opposite second lateral side (e.g., the lower lateral side in the second direction DR2 in a plan view in a plane defined in the first and second directions DR1, DR2). The non-display area protrusion PR_8 may protrude towards the display area DPA and may be surrounded (e.g., in the first direction DR1) by the display area DPA which is positioned on first and second lateral sides of the non-display area protrusion PR_8 in the first direction DR1.

In the non-display area NDA extending in the first direction DR1, the width (e.g., length in the second direction DR2) of the portion in which the non-display area protrusion PR_8 is positioned may be larger than the width (e.g., length in the second direction DR2) of the portion in which the non-display area protrusion PR_8 is not positioned. Accordingly, the width of the display area DPA (e.g., length in the second direction DR2) that is positioned on the second lateral side of the non-display area protrusion PR_8 in the second direction DR2 may be smaller than the width (e.g., length in the second direction DR2) of the display area DPA that is positioned on the first lateral side of the non-display area NDA in the second direction DR2 in which the non-display area protrusion PR_8 is positioned.

Accordingly, the bonding layer 300_8 according to the present exemplary embodiment may further include the second area protrusion 321_8. The second area protrusion 321_8 may be disposed in the non-display area protrusion PR_8 and may be disposed to overlap the non-display area protrusion PR_8. The second area protrusion 321_8 may be formed to protrude from the second area 320_8 positioned on a first lateral side (e.g., the upper side in the second direction DR2 in a plan view) towards the second lateral side (e.g., the lower side in the second direction DR2 in a plan view). The second area protrusion 321_8 may protrude towards the first area 310. For example, the first area 310 may surround the second area protrusion 321_8 in the first direction DR1 and may be positioned adjacent a first lateral side and an opposite second lateral side of the second area protrusion 321_8 in the first direction DR1.

In the bonding layer 300_8 extending in the first direction DR1, the width (e.g., length in the second direction DR2) of the portion in which the second area protrusion 321_8 is positioned may be larger than the width (e.g., length in the second direction DR2) of the portion in which the second area protrusion 321_8 is not positioned. Accordingly, the width of the first area 310 in the second direction DR2 that is positioned on the second lateral side of the second area protrusion 320_8 (e.g., the lower side in the second direction DR2 in a plan view) may be smaller than the width of the first area 310 in the second direction DR2 that is positioned on the first side of the bonding layer 300_8 in the second direction DR2 in which the second area protrusion 320_8 is positioned.

Figure 27:
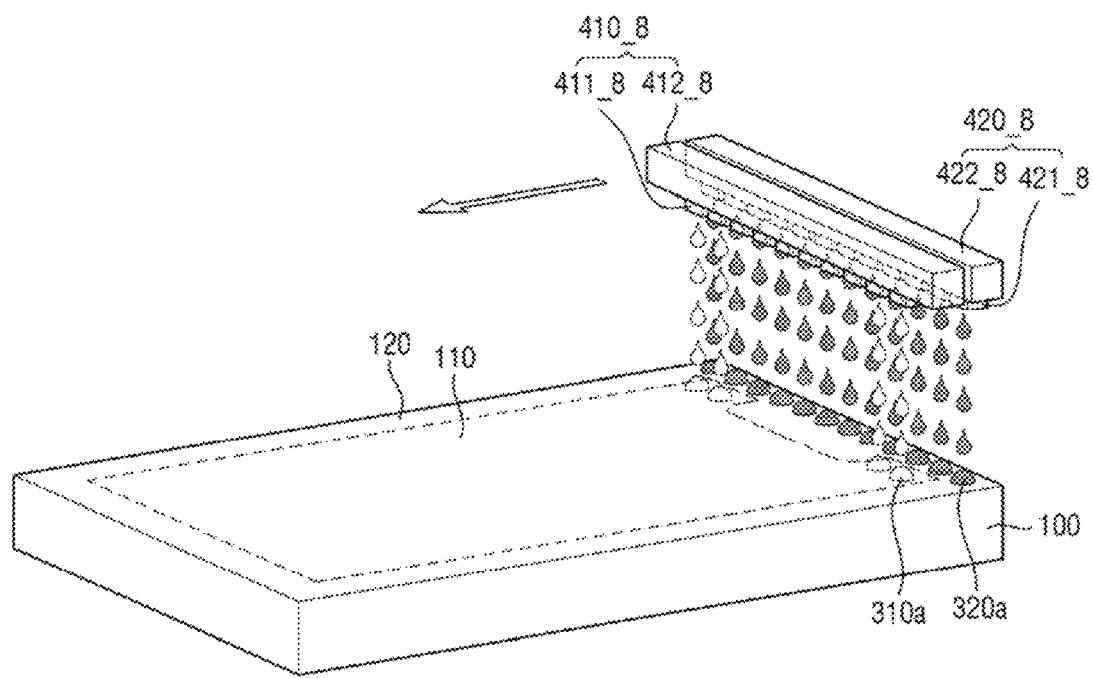
FIGS. 27 to 30 are perspective views illustrating steps of applying the first ink and the second ink according to the method of manufacturing the display device according to still other exemplary embodiments of the present inventive concepts.
Figure 27:
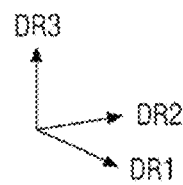

Referring further to FIG. 27, in the method of manufacturing the display device according to the present exemplary embodiment, the first print unit 410_8 may include a plurality of first inkjet heads 411_8 and a first print head 412_8, and the second print unit 420_8 may include a plurality of second inkjet heads 421_8 and a second print head 422_8.

When the second ink 320a is applied (e.g., applied to the second area 120 of the display panel 100), which is disposed on a first lateral side of the display device 10_8 in the second direction DR2 and extends in the first direction DR1, corresponding to the second area 320_8 including the second area protrusion 321_8, the second ink 320a may be ejected from at least a majority of the second inkjet heads 421_8 of the second print unit 420_8. At the same time, the first ink 310a from the first print unit 410_8 may be ejected on the area (e.g., the first area 110 of the display panel 100) corresponding to the display area DPA. However, in the process of the first print unit 410_8 ejecting the first ink 310a, the first ink 310a may not be applied to the second area 120 of the display panel 100 corresponding to the second area protrusion 321_8. For example, the first print unit 410_8 ejects the first ink 310a on the portion except for the second area 120 of the display panel 100 corresponding to the second area protrusion 321_8.

Figure 28:
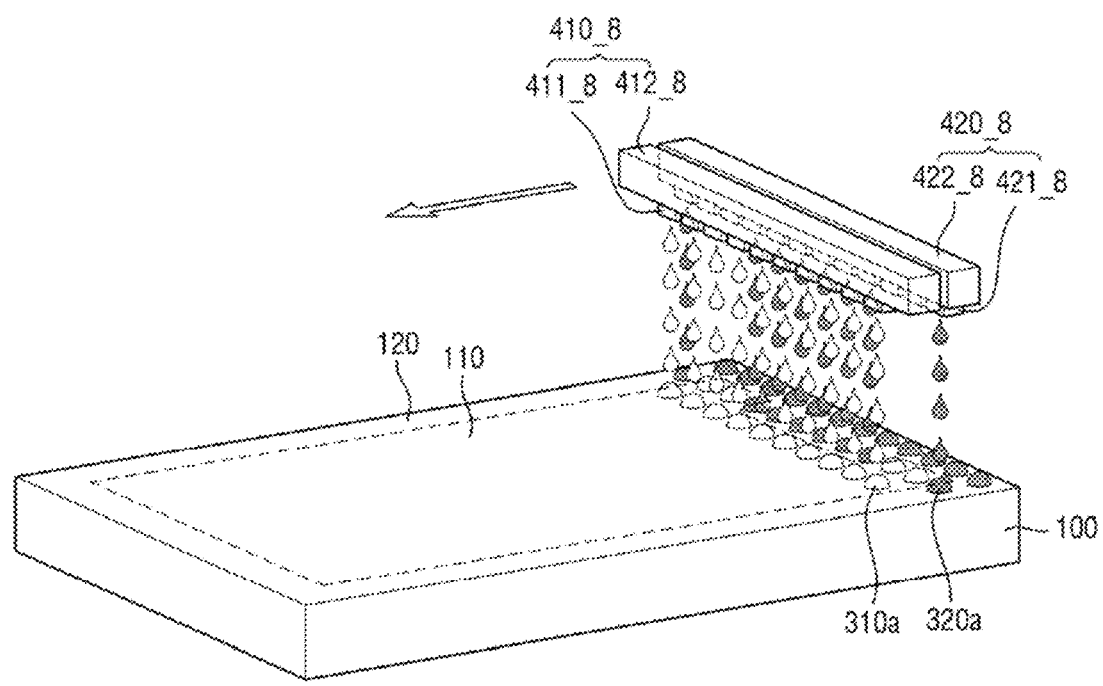
Figure 28:
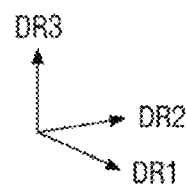

Referring to the exemplary embodiment of FIG. 28, while moving to the second lateral side of the display device in the second direction DR2, the second print unit 420_8 may eject the second ink 320a on the area on which the first print unit 410_8 has not ejected the first ink 310a in the above step. For example, the second print unit 420_8 may eject the second ink 320a on the second area 120 of the display panel 100 corresponding to the second area protrusion 321_8 and the second area 120 of the display panel 100 extending in the second direction DR2.

The first ink 310a may have already been ejected on the first and second lateral sides of the second area 120 of the display panel 100 in the first direction DR1 corresponding to the second area protrusion 321_8. However, exemplary embodiments of the present inventive concepts are not limited thereto. Accordingly, the second print unit 420_8 may eject the second ink 320a from the second inkjet head 421_8 positioned at first and second lateral sides of the display device in the first direction DR1, and the second inkjet head 421_8 positioned near the center (e.g., corresponding to the second area protrusion 321_8), among the plurality of second inkjet heads 421_8. However, exemplary embodiments of the present inventive concepts are not limited thereto, and the second inkjet head 421_8 ejecting the second ink 320a at this step may be changed according to the shape of the second area 320_8 of the bonding layer 300_8.

Figure 29:
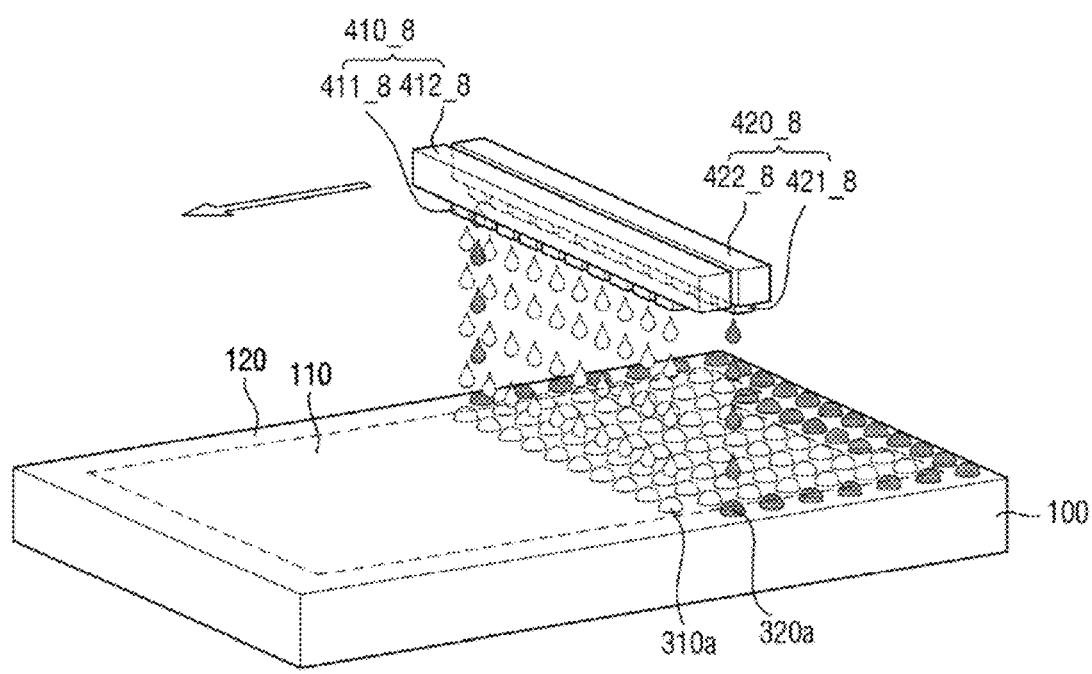

Referring further to FIG. 29, while moving to the second lateral side of the display device in the second direction DR2, the first print unit 410_8 may eject the first ink 310a on the first area 110 of the display panel 100. In this process, the second print unit 420_8 may eject the second ink 320a only from a partial portion of the second inkjet heads 421_8 which are positioned at first and second lateral ends of the display device in the first direction DR1. Accordingly, the second inkjet head 421_8 may eject the second ink 320a on partial areas positioned on the first and second lateral sides of the first area 110 of the display panel 100 in the first direction DR1, in the second area 120 of the display panel 100.

Figure 30:
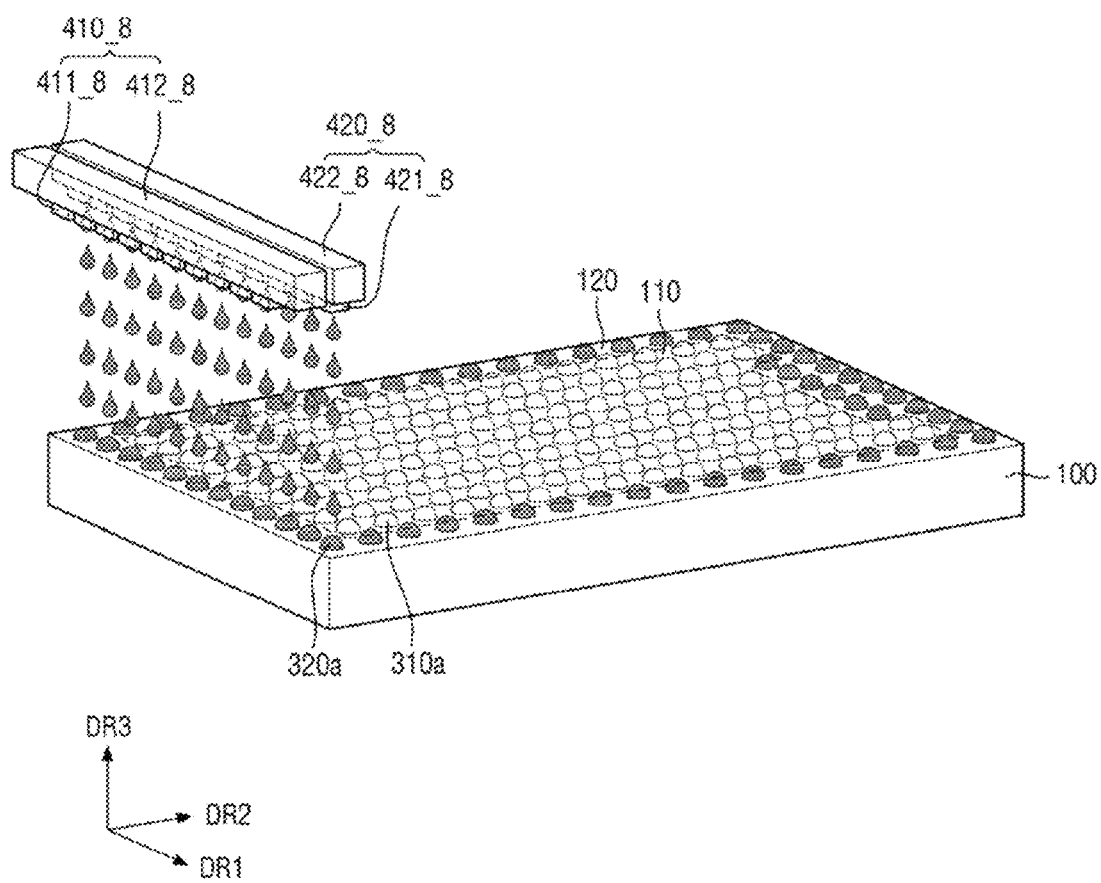

Referring to FIG. 30, when the second ink 320a is applied to the second area 120 of the display panel 100 disposed on the second lateral side of the display device 10_8 in the second direction DR2 and extending in the first direction DR1, the second ink 320a may be ejected from at least a majority of the second inkjet heads 421_8 of the second print unit 420_8. In this case, the first print unit 410_8 may not eject the first ink 310a.

Since the subsequent processes have already been described, a duplicate description is omitted.

In the above, a display device having a portion (e.g., the non-display area protrusion PR_8) partially protruding from the non-display area NDA has been described, but the above description may also be applied to a case in which a separate non-display area positioned within the display area DPA is formed separately from the non-display area NDA.

In the exemplary embodiments of FIGS. 25-30, the second area 320_8 of the bonding layer 300_8 may still be formed in the process of forming the bonding layer 300_8 that bonds the protection member 200 and the display panel 100. Accordingly, as described above, process reliability and process efficiency may increase, cost may be reduced, and the thickness of the display device 10_8 may decrease. In addition, the second areas 320_8 of various shapes corresponding to the non-display area NDA formed in various shapes may be formed in one process, thereby improving process efficiency.

In concluding the detailed description, those skilled in the art will appreciate that many variations and modifications can be made to the disclosed exemplary embodiments without substantially departing from the principles of the present inventive concepts. Therefore, the disclosed exemplary embodiments of the present inventive concepts are used in a generic and descriptive sense only and not for purposes of limitation.

What is claimed is:

1. A display device comprising:
   a display panel;
   a protection member disposed on the display panel;
   a bonding layer disposed between the display panel and the protection member, the bonding layer is configured to bond the display panel and the protection member; and
   the bonding layer includes a first area having a first light transmittance and a second area having a second light transmittance that is lower than the first light transmittance.

2. The display device of claim 1, wherein the display device includes a display area configured to display at least one image and a non-display area that is not configured to display images, the first area is disposed within the display area, and the second area is disposed within the non-display area.

3. The display device of claim 1, wherein the first light transmittance is greater than or equal to about 95%, and the second light transmittance is less than or equal to about 1%.

4. The display device of claim 1, wherein the second area is disposed to surround the first area.

5. The display device of claim 4, wherein a thickness of the first area of the bonding layer is substantially equal to a thickness of the second area of the bonding layer.

6. The display device of claim 5, wherein the thickness of the first area and the thickness of the second area are in a range of about 25 μm to about 50 μm.

7. The display device of claim 1, wherein:
   a first surface of the first area of the bonding layer and a first surface of the second area of the bonding layer directly contact the display panel and are bonded to the display panel; and
   a difference between a bonding strength at which the first surface of the first area of the bonding layer is bonded to the display panel and a bonding strength at which the first surface of the second area of the bonding layer is bonded to the display panel is about 10% or less.

8. The display device of claim 7, wherein a second surface of the first area of the bonding layer that is opposite the first surface of the first area of the bonding layer and a second surface of the second area of the bonding layer that is opposite the first surface of the second area of the bonding layer directly contact and are bonded to the protection member.

9. The display device of claim 8, wherein a difference between a bonding strength at which the second surface of the first area of the bonding layer is bonded to the protection member and a bonding strength at which the second surface of the second area of the bonding layer is bonded to the protection member is about 10% or less.

10. The display device of claim 1, wherein the bonding layer further includes a boundary area positioned between the first area and the second area, the boundary area having a third light transmittance that is less than the first light transmittance and greater than the second light transmittance.

11. The display device of claim 10, wherein the third light transmittance decreases as a distance to the second area decreases.

12. The display device of claim 1, wherein the protection member further includes a printed layer disposed on a first surface of the protection member; and
at least a partial portion of the printed layer overlaps the second area.

13. The display device of claim 12, wherein:
a first surface of the first area of the bonding layer and a first surface of the second area of the bonding layer directly contact the display panel and are bonded to the display panel;
a second surface of the second area of the bonding layer directly contacts the printed layer; and
a thickness of the printed layer is in a range of about 10 μm or less.

14. The display device of claim 1, wherein the first area and the second area of the bonding layer include the same transparent resin, and the second area further includes a pigment and/or dye.

15. A method of manufacturing a display device, comprising:
an ink application step including applying a first ink having a first light transmittance on a first area of a first substrate, and applying a second ink having a second light transmittance that is lower than the first light transmittance on a second area of the first substrate;
disposing and pressing a second substrate on the first substrate having the first ink and the second ink applied thereto; and
curing the first ink and the second ink to form a bonding layer that is configured to bond the first substrate and the second substrate,
wherein one of the first substrate and the second substrate is a display panel, and the other one of the first substrate and the second substrate is a protection member.

16. The display device of claim 15, wherein at least a partial portion of the applying of the first ink and at least a partial portion of the applying of the second ink are performed simultaneously.

17. The display device of claim 15, wherein the ink application step includes simultaneously applying the first ink and the second ink.

18. The display device of claim 17, wherein the first ink is not applied when the second ink is applied in the ink application step.

19. The display device of claim 15, wherein:
the ink application step is performed by an inkjet printing apparatus including a first print unit having a plurality of inkjet heads arranged along a first direction; and
the plurality of inkjet heads includes a plurality of first inkjet heads that is configured to discharge the first ink and at least one second inkjet head that is configured to discharge the second ink,
wherein the at least one second inkjet head is disposed on a first lateral side of the plurality of first inkjet heads with respect to the first direction and/or a second lateral side that is opposite to the first lateral side of the plurality of first inkjet heads with respect to the first direction.

20. The display device of claim 15, wherein:
the ink application step is performed by an inkjet printing apparatus including a first print unit and a second print unit;
the first print unit includes a plurality of first inkjet heads that are arranged in a first direction and are configured to discharge the first ink; and
the second print unit includes a plurality of second inkjet heads that are arranged in the first direction and are configured to discharge the second ink,
wherein the second print unit is disposed adjacent to the first print unit in a second direction that crosses the first direction.

* * * * *